(12) United States Patent
Koh et al.

(10) Patent No.: US 11,696,447 B2
(45) Date of Patent: Jul. 4, 2023

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Beyounghyun Koh, Seoul (KR); Seungmin Song, Hwaseong-si (KR); Joongshik Shin, Yongin-si (KR); Yongjin Kwon, Yongin-si (KR); Jinhyuk Kim, Hwaseong-si (KR); Hongik Son, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 235 days.

(21) Appl. No.: 17/241,232

(22) Filed: Apr. 27, 2021

(65) Prior Publication Data
US 2022/0093630 A1    Mar. 24, 2022

(30) Foreign Application Priority Data
Sep. 23, 2020 (KR) .......................... 10-2020-0122991

(51) Int. Cl.
| | |
|---|---|
| H01L 23/00 | (2006.01) |
| H10B 43/50 | (2023.01) |
| H01L 23/535 | (2006.01) |
| H01L 21/768 | (2006.01) |
| H10B 41/27 | (2023.01) |
| H10B 41/41 | (2023.01) |

(Continued)

(52) U.S. Cl.
CPC ....... *H10B 43/50* (2023.02); *H01L 21/76805* (2013.01); *H01L 21/76895* (2013.01); *H01L 23/535* (2013.01); *H01L 23/562* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC ......... H01L 21/76805; H01L 21/76895; H01L 23/535; H01L 23/562
See application file for complete search history.

(56) References Cited

U.S. PATENT DOCUMENTS

| | | |
|---|---|---|
| 8,541,831 B2 | 9/2013 | Chae et al. |
| 8,847,302 B2 | 9/2014 | Alsmeier et al. |

(Continued)

*Primary Examiner* — Thao P Le
(74) *Attorney, Agent, or Firm* — Lee IP Law, P.C.

(57) ABSTRACT

A semiconductor device includes a substrate having cell array and extension regions, a gate electrode structure having gate electrodes stacked in a first direction, a channel through the gate electrode structure on the cell array region, a first division pattern extending in the second direction on the cell array and extension regions, the first division pattern being at opposite sides of the gate electrode structure in a third direction, an insulation pattern structure partially through the gate electrode structure on the extension region, a through via through the insulation pattern structure, and a support layer on the gate electrode structure and extending on the cell array and extension regions, the support layer contacting an upper sidewall of the first division pattern, and the support layer not contacting an upper surface of a portion of the first division pattern on the extension region adjacent to the insulation pattern structure.

20 Claims, 39 Drawing Sheets

(51) Int. Cl.
   *H10B 41/50*   (2023.01)
   *H10B 43/27*   (2023.01)
   *H10B 43/40*   (2023.01)

(56) References Cited

U.S. PATENT DOCUMENTS

| | | | | |
|---|---|---|---|---|
| 9,508,730 | B2 * | 11/2016 | Lee | H01L 27/11507 |
| 9,530,789 | B2 | 12/2016 | Lee et al. | |
| 10,043,781 | B2 | 8/2018 | Sekar et al. | |
| 10,192,880 | B2 * | 1/2019 | Lee | H01L 27/11568 |
| 11,563,023 | B2 * | 1/2023 | Ahn | H01L 27/11582 |
| 2015/0318301 | A1 * | 11/2015 | Lee | H10B 43/10 |
| | | | | 257/324 |
| 2017/0103996 | A1 * | 4/2017 | Lee | H10B 43/27 |
| 2017/0170191 | A1 * | 6/2017 | Lee | H10B 43/50 |
| 2017/0358590 | A1 * | 12/2017 | Kang | H10B 43/27 |
| 2018/0130814 | A1 * | 5/2018 | Lee | H10B 43/27 |
| 2018/0350831 | A1 * | 12/2018 | Kim | H10B 41/40 |
| 2019/0035808 | A1 * | 1/2019 | Hwang | H01L 23/528 |
| 2020/0006358 | A1 * | 1/2020 | Nishikawa | H01L 21/76802 |
| 2020/0043943 | A1 * | 2/2020 | Kang | H01L 29/456 |
| 2020/0135760 | A1 * | 4/2020 | Kim | H01L 21/67178 |
| 2020/0203495 | A1 * | 6/2020 | Shin | H10B 41/50 |
| 2021/0036001 | A1 * | 2/2021 | Kim | H01L 28/90 |
| 2021/0118902 | A1 * | 4/2021 | Kanamori | H10B 43/50 |
| 2021/0151462 | A1 * | 5/2021 | Baek | H10B 43/40 |
| 2021/0265388 | A1 * | 8/2021 | Baek | H10B 43/50 |
| 2021/0407845 | A1 * | 12/2021 | Wang | H10B 43/10 |
| 2021/0408038 | A1 * | 12/2021 | Lin | H10B 43/27 |
| 2021/0408045 | A1 * | 12/2021 | Chiang | H01L 29/78391 |
| 2021/0408046 | A1 * | 12/2021 | Chang | H10B 51/50 |
| 2022/0085064 | A1 * | 3/2022 | Moon | H10B 41/27 |
| 2022/0093630 | A1 * | 3/2022 | Koh | H10B 43/50 |
| 2022/0189876 | A1 * | 6/2022 | Lim | H10B 43/27 |
| 2022/0199783 | A1 * | 6/2022 | Penumatcha | H01L 29/42356 |
| 2022/0285393 | A1 * | 9/2022 | Young | H10B 43/10 |
| 2022/0336298 | A1 * | 10/2022 | Kim | H10B 43/27 |
| 2022/0344365 | A1 * | 10/2022 | Fujimura | H10B 43/50 |
| 2022/0367511 | A1 * | 11/2022 | Hwang | H01L 23/5226 |

* cited by examiner

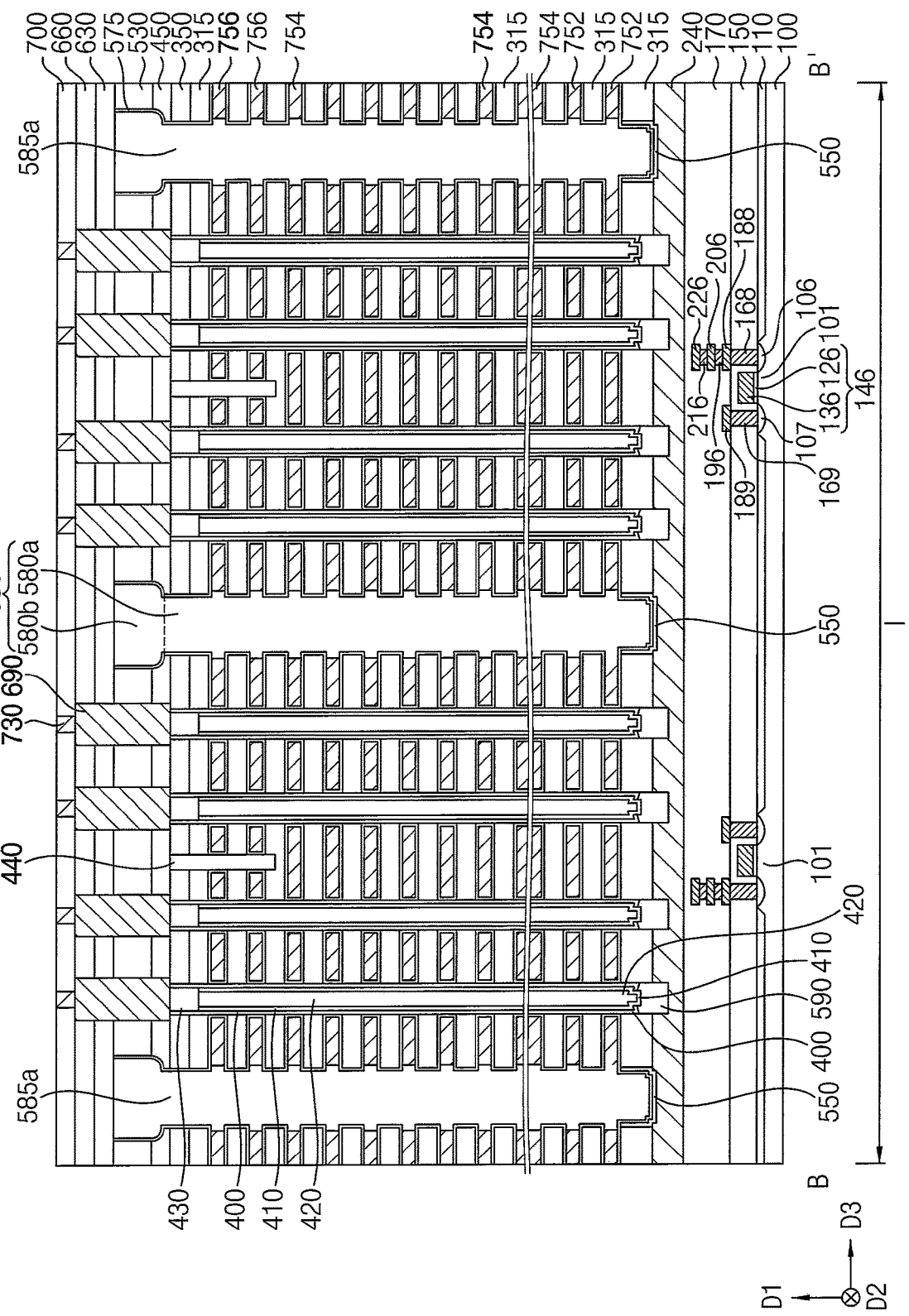

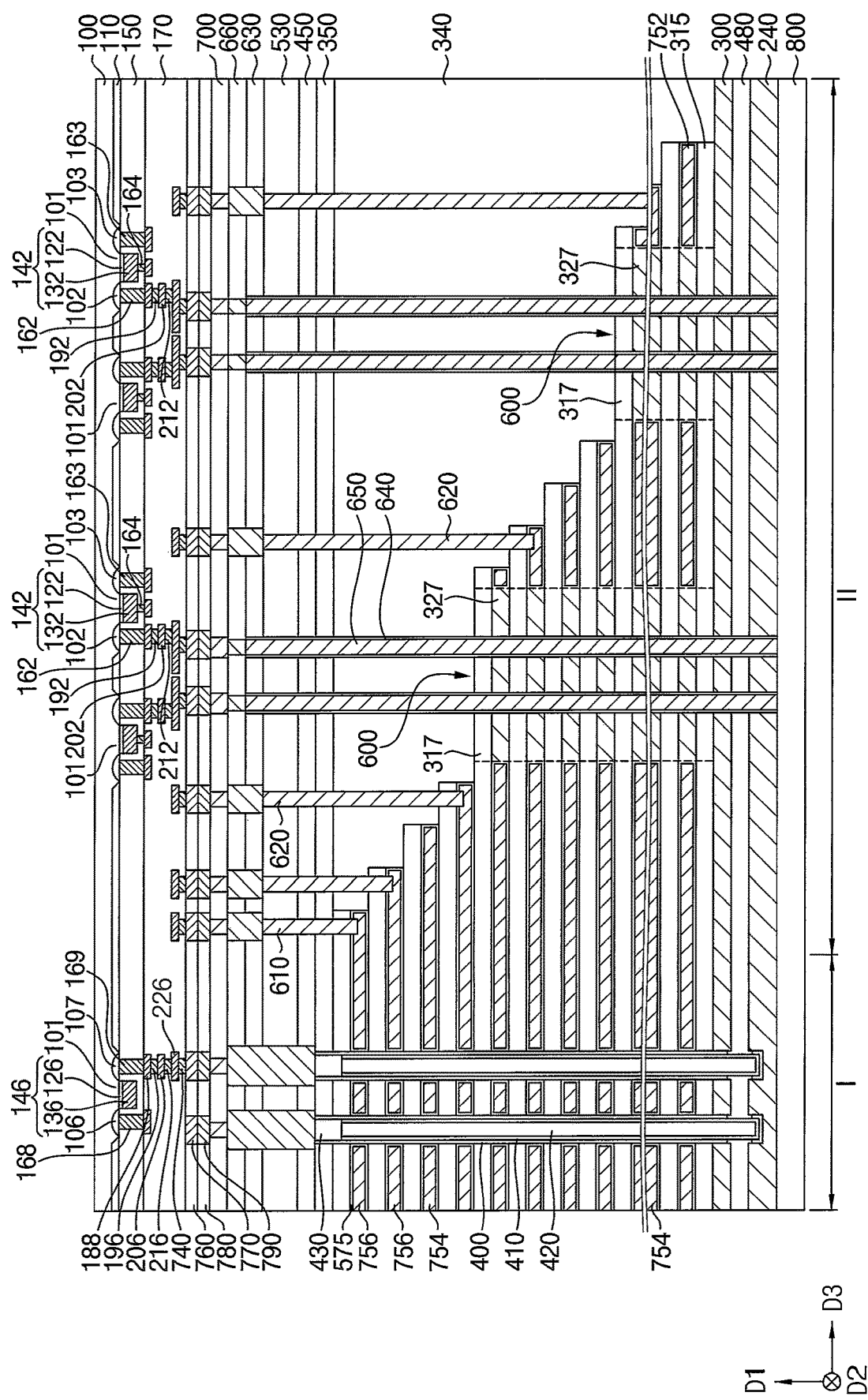

SEMICONDUCTOR DEVICE AND ELECTRONIC SYSTEM INCLUDING THE SAME

CROSS-REFERENCE TO RELATED APPLICATION

This application claims priority under 35 U.S.C. § 119 to Korean Patent Application No. 10-2020-0122991, filed on Sep. 23, 2020, in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

An electronic system requiring data storage needs a high capacity semiconductor device that may store high capacity data. Thus, the number of stacked gate electrodes in the semiconductor device may increase.

SUMMARY

According to an aspect of embodiments, there is provided a semiconductor device. The semiconductor device may include a substrate including a cell array region and an extension region at least partially surrounding the cell array region, a gate electrode structure including gate electrodes spaced apart from each other on the cell array region and the extension region of the substrate in a first direction substantially perpendicular to an upper surface of the substrate, a channel extending in the first direction through the gate electrode structure on the cell array region of the substrate, a first division pattern extending in a second direction substantially parallel to the upper surface of the substrate at each of opposite sides in a third direction substantially parallel to the upper surface of the substrate and crossing the second direction of the gate electrode structure on the cell array region and the extension region of the substrate, an insulation pattern structure partially extending through the gate electrode structure on the extension region of the substrate, a through via extending in the first direction through the insulation pattern structure, and a support layer on the gate electrode structure and extending on the cell array region and the extension region of the substrate. The substrate may have memory cells on the cell array region. Each of the gate electrodes may extend in the second direction. Each of the first division patterns may extend in the second direction. The support layer may contact an upper sidewall of the first division pattern, and may not contact an upper surface of a portion of the first division pattern on the extension region of the substrate that is adjacent to the insulation pattern structure in the third direction.

According to an aspect of embodiments, there is provided a semiconductor device. The semiconductor device may include a substrate including a cell array region and an extension region at least partially surrounding the cell array region, gate electrode structures each including gate electrodes spaced apart from each other on the cell array region and the extension region of the substrate in a first direction substantially perpendicular to an upper surface of the substrate, a channel extending in the first direction through each of the gate electrode structure on the cell array region of the substrate, a first division pattern extending in a second direction substantially parallel to the upper surface of the substrate between the gate electrode structures on the cell array region and the extension region of the substrate, and a support layer on the gate electrode structures. The substrate may have memory cells on the cell array region. The gate electrodes may be arranged in a staircase shape of which an extension length in the second direction decreases in a stepwise manner from a lower level to an upper level, and may have end portions in the second direction on the extension region of the substrate. Each of the gate electrode structures spaced apart from each other in a third direction substantially parallel to the upper surface of the substrate and crossing the second direction. The first division pattern may divide the gate electrode structures from each other. The support layer may extend on the cell array region and the extension region of the substrate, may contact an upper sidewall of the first division pattern, may not contact an upper surface of a first portion of the first division pattern on the extension region of the substrate, and may partially contact an upper surface of a second portion of the first division pattern on the cell array region of the substrate.

According to an aspect of embodiments, there is provided an electronic system. The electronic system may include a semiconductor device and a controller for controlling the semiconductor device. The semiconductor device may include a memory cell structure, peripheral circuit wirings applying electrical signals to the memory cell structure, and an input/out pad electrically connected to the peripheral circuit wirings. The memory cell structure may include a substrate including a cell array region and an extension region at least partially surrounding the cell array region, a gate electrode structure including gate electrodes spaced apart from each other on the cell array region and the extension region of the substrate in a first direction substantially perpendicular to an upper surface of the substrate, a channel extending in the first direction through the gate electrode structure on the cell array region of the substrate, a first division pattern extending in a second direction substantially parallel to the upper surface of the substrate at each of opposite sides in a third direction substantially parallel to the upper surface of the substrate and crossing the second direction of the gate electrode structure on the cell array region and the extension region of the substrate, an insulation pattern structure partially extending through the gate electrode structure on the extension region of the substrate, a through via extending in the first direction through the insulation pattern structure, and a support layer on the gate electrode structure on the cell array region and the extension region of the substrate. Memory cells may be formed on the cell array region of the substrate. Each of the gate electrodes may extend in the second direction. Each of the first division patterns may extend in the second direction. The support layer may contact an upper sidewall of the first division pattern, and may not contact an upper surface of a portion of the first division pattern adjacent to the insulation pattern structure in the third direction on the extension region of the substrate. The controller may be electrically connected to the semiconductor device through the input/output pad.

BRIEF DESCRIPTION OF THE DRAWINGS

Features will become apparent to those of skill in the art by describing in detail exemplary embodiments with reference to the attached drawings, in which:

FIG. 37 is a cross-sectional view of a semiconductor device in accordance with example embodiments.

FIG. 38 is a cross-sectional view of a semiconductor device in accordance with example embodiments.

DETAILED DESCRIPTION

Figure 1:
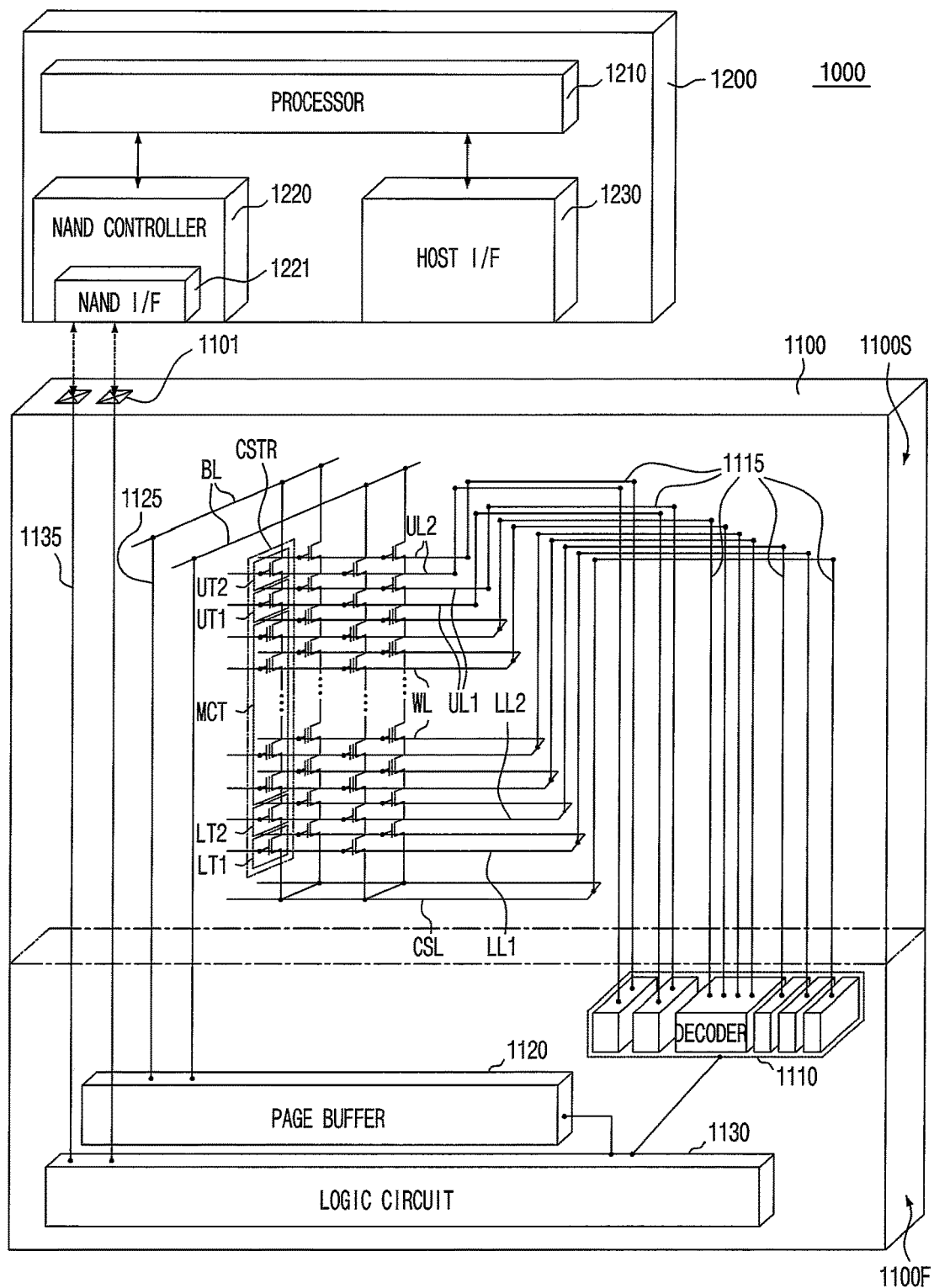
FIG. 1 is a schematic diagram of an electronic system including a semiconductor device in accordance with example embodiments.

FIG. 1 is a schematic diagram illustrating an electronic system including a semiconductor device in accordance with example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device, e.g., a NAND flash memory device that will be illustrated with reference to FIGS. 29 to 38. The semiconductor device 1100 may include a first structure 1100F and a second structure 1100S on the first structure 1100F. In the drawing, the first structure 1100F is disposed under the second structure 1100S, however, embodiments are not limited thereto, e.g., the first structure 1100F may be beside or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other serially. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface (I/F) 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When control command is received from the outside host through the host interface 1230, the processor 1210 may control the semiconductor device 1100 in response to the control command.

Figure 2:
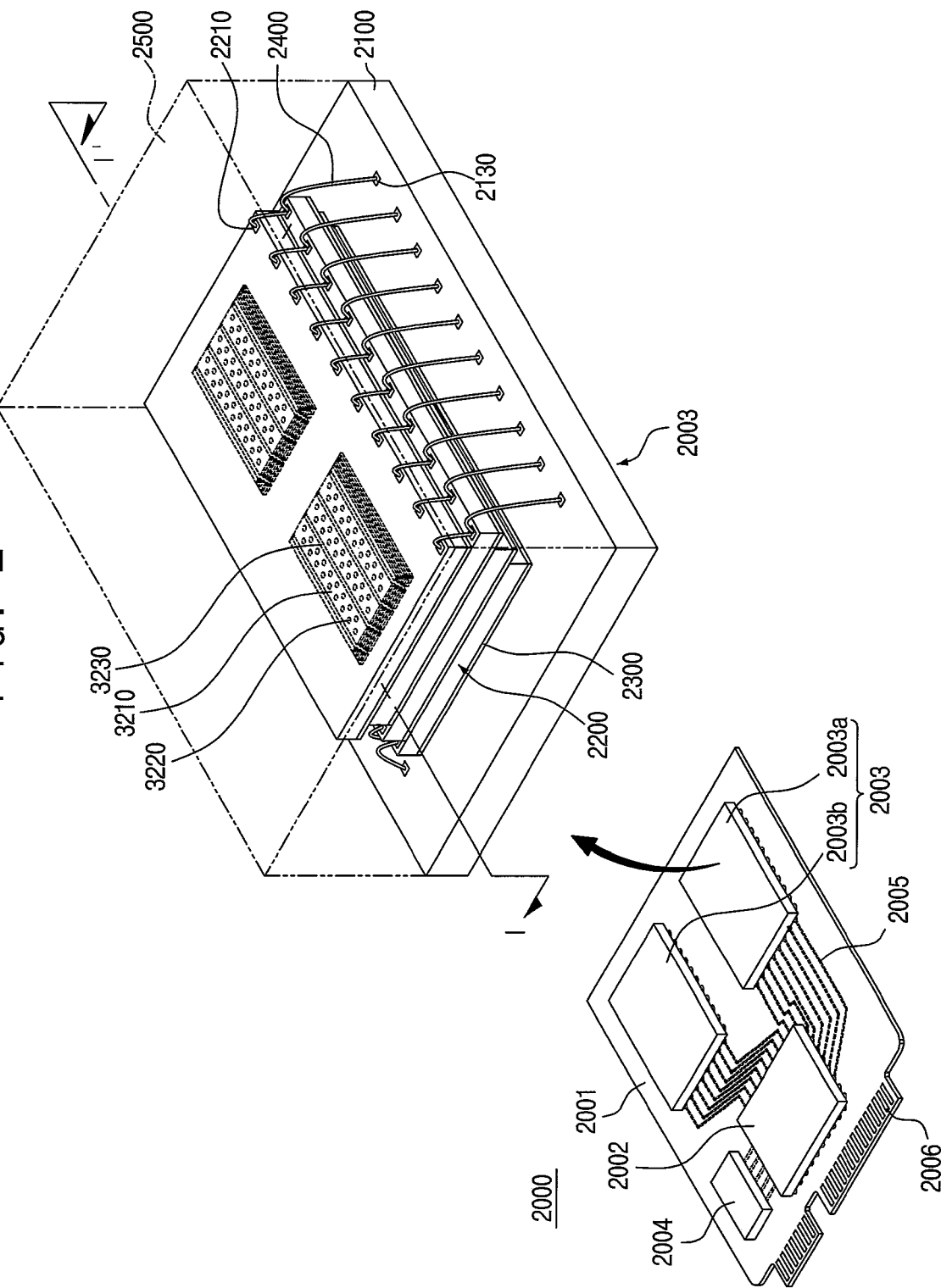
FIG. 2 is a schematic perspective view of an electronic system including a semiconductor device in accordance with example embodiments.

FIG. 2 is a schematic perspective view illustrating an electronic system including a semiconductor device in accordance with example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected with each other by wiring patterns 2005 on the main substrate 2001.

The main substrate 2001 may include a connector 2006 having a plurality of pins connected to an outside host. The number and layout of the plurality of pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages, each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) covering package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 29 to 38.

In example embodiments, the connection structure 2400 may be a bonding wire for electrically connecting the input/output pad 2210 and the package upper pads 2130. Thus, in the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including through silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
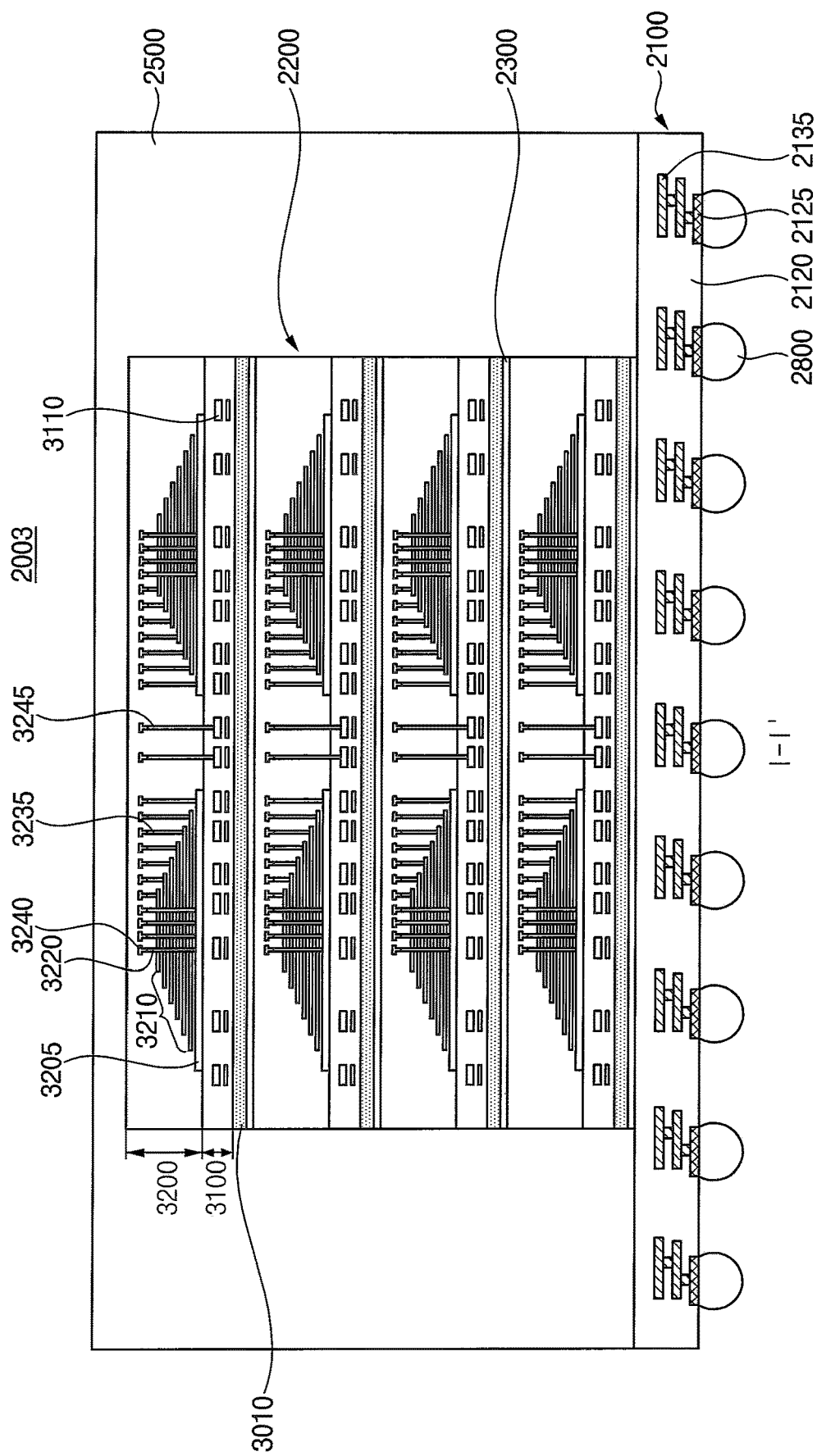
FIGS. 3 and 4 are schematic cross-sectional views of semiconductor packages including a semiconductor device in accordance with example embodiments.
Figure 4:
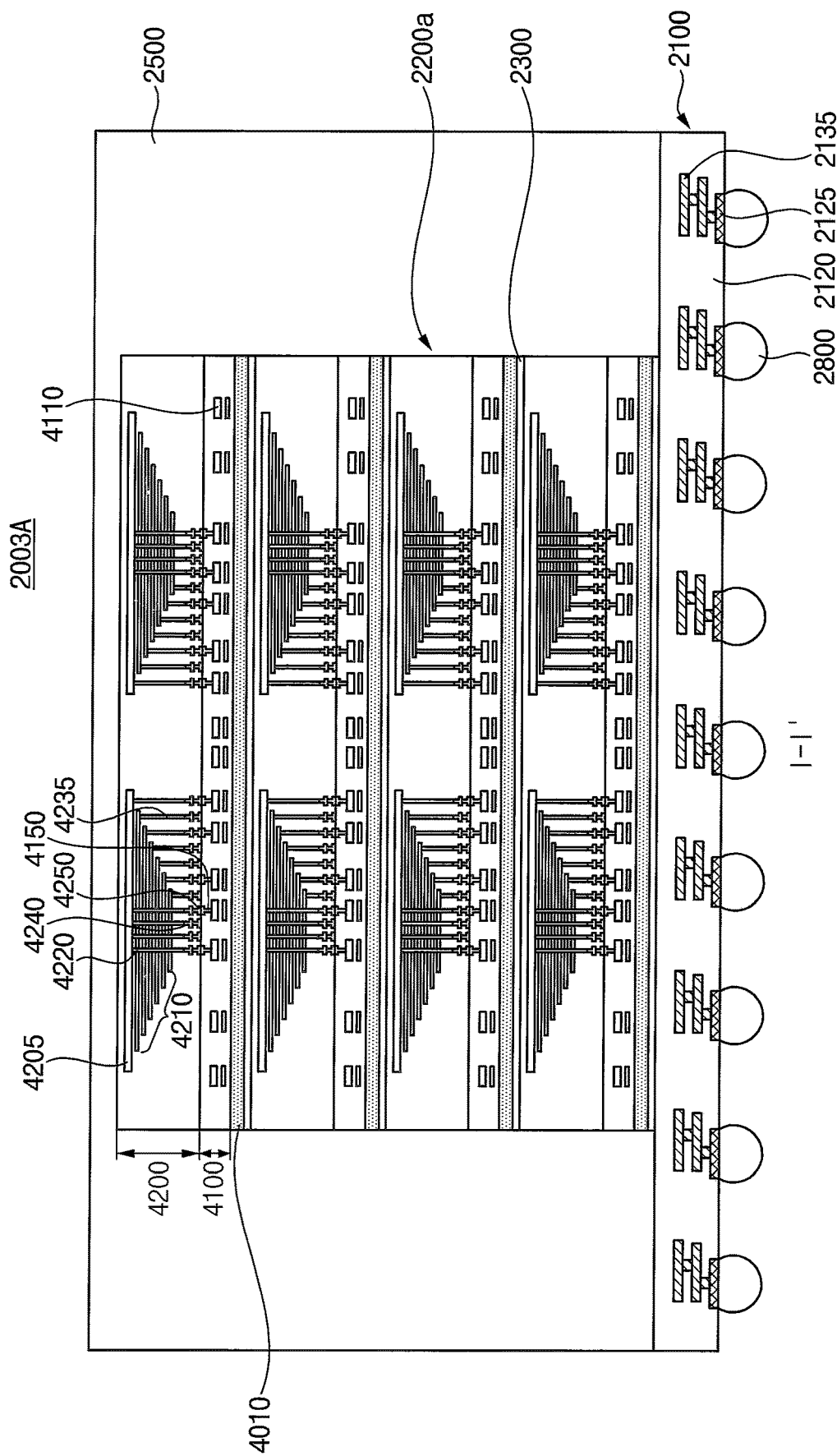

FIGS. 3 and 4 are schematic cross-sectional views illustrating semiconductor packages, each of which may include a semiconductor device in accordance with example embodiments. FIGS. 3 and 4 illustrate example embodiments of the semiconductor package 2003 shown in FIG. 2, and show a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, the upper pads 2130 (refer to FIG. 2) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 inside of the substrate body part 2120. The upper pads 2130 may be electrically connected to the connection structures 2400. The lower pads 2125 may be connected to the wiring patterns 2005 of the main substrate 2010 in the electronic system 2000 through conductive connection parts 2800, as illustrated in FIG. 2.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, the gate electrode structure 3210 on the common source line 3205, the memory channel structures 3220, and the division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

Each of the semiconductor chips 2200 may include a through wiring 3245 electrically connected to the peripheral circuit wirings 3110 of the first structure 3100 and extending in the second structure 3200. The through wiring 3245 may be disposed outside of the gate electrode structure 3210, and some through wirings 3245 may extend through the gate electrode structure 3210. Each semiconductor chip 2200 may further include the input/output pad 2210 (refer to FIG. 2) electrically connected to the peripheral circuit wirings 3110 of the first structure 3100.

Referring to FIG. 4, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include, e.g., copper.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 and the semiconductor chips 2200a of FIG. 4 may be electrically connected with each other by the connection structures 2400 in a bonding wire method. However, in example embodiments, semiconductor chips such as the semiconductor chips 2200 of FIG. 3 and the semiconductor chips 2200a of FIG. 4 in the same semiconductor package may be electrically connected with each other by a connection structure including a TSV.

FIGS. 5 to 34 are plan views and cross-sectional views illustrating stages in a method of manufacturing a semiconductor device in accordance with example embodiments. Particularly, FIGS. 5, 6, 10, 12, 17, 20, 27 and 29 are the plan views, and FIGS. 7-9, 11, 13-16, 18-19, 21-26, 28 and 30-34 are the cross-sectional views.

FIGS. 7-9, 11A, 28, 30 and 31 are cross-sectional views taken along lines A-A' of corresponding plan views, respectively, FIGS. 13-16, 18, 19, 21, 23, 25, 32 and 34 are cross-sectional views taken along lines B-B' of corresponding plan views, respectively, and FIGS. 22, 24, 26 and 33 are cross-sectional views taken along lines C-C' of corresponding plan views, respectively. FIGS. 6 to 34 are drawings of region X of FIG. 5, and FIG. 11B is an enlarged cross-sectional view of region Y of FIG. 11A.

This semiconductor device may correspond to the second structure 1100S of FIG. 1, the semiconductor chips 2200 of FIG. 2, and the second structure 3200 of FIG. 3.

Hereinafter, in the specification (but not necessarily in the claims) a direction substantially perpendicular to an upper surface of a first substrate may be defined as a first direction D1, and two directions substantially parallel to the upper surface of the first substrate and crossing each other may be defined as second and third directions D2 and D3, respectively. In example embodiments, the second and third directions D2 and D3 may be substantially perpendicular to each other.

Figure 5:
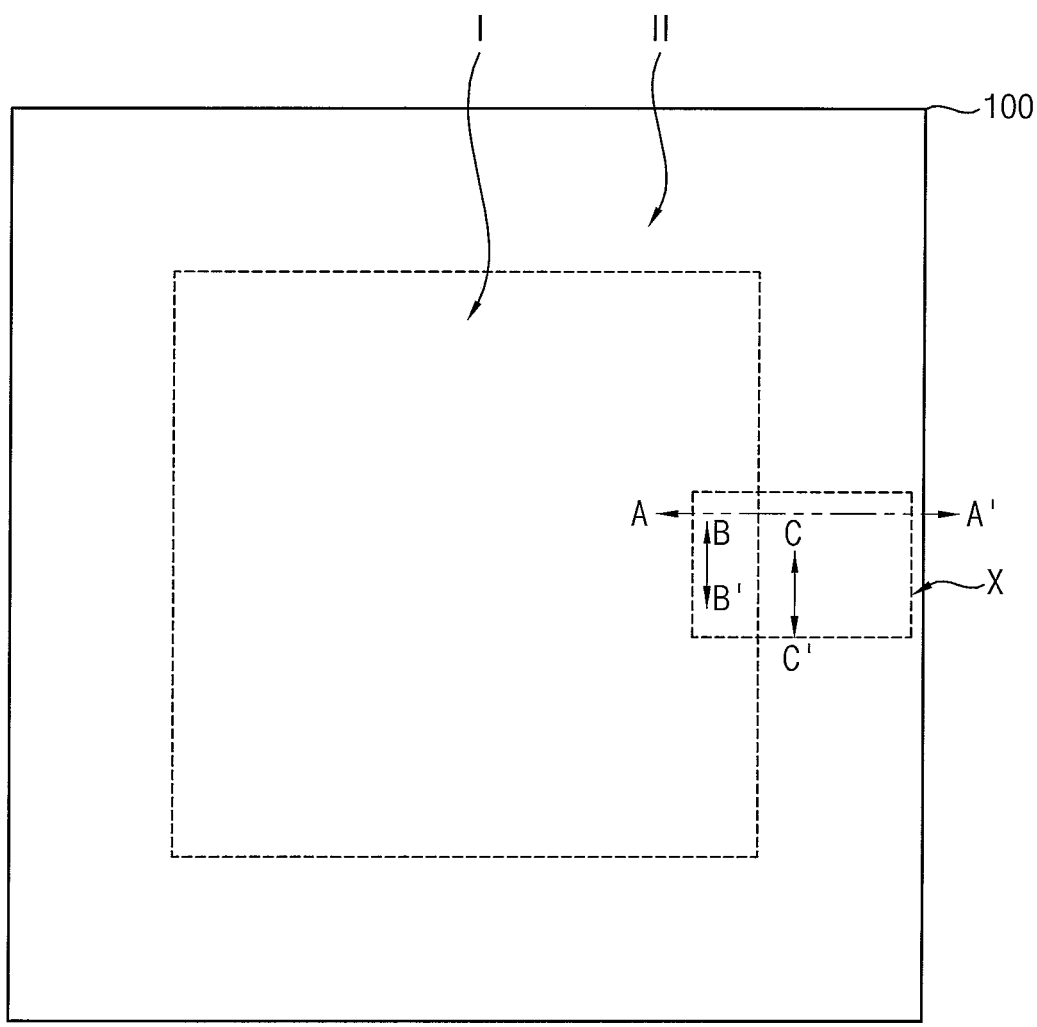
FIGS. 5 to 34 are plan views and cross-sectional views of stages in a method of manufacturing a vertical memory device in accordance with example embodiments.

Referring to FIG. 5, a first substrate 100 may include a first region I and a second region II at least partially surrounding the first region I.

The first substrate 100 may include, e.g., silicon, germanium, silicon-germanium or a III-V compound such as GaP, GaAs, GaSb, etc. In some embodiments, the first substrate 100 may be, e.g., a silicon-on-insulator (SOI) substrate or a germanium-on-insulator (GOI) substrate.

In example embodiments, the first and second regions I and II of the first substrate 100 may be a cell array region and a pad region or an extension region, respectively, both of which together may form a cell region. That is, memory cells, each of which may include a gate electrode, a channel, and a charge storage structure, may be formed on the first region I of the first substrate 100, and upper contact plugs for transferring electrical signals to the memory cells and pads contacting the upper contact plugs may be formed on the second region II of the first substrate 100. In the drawing, the second region II of the first substrate 100 entirely surrounds the first region I of the first substrate 100, however, embodiments are not limited thereto. For example, the second region II of the first substrate 100 may be formed at each of opposite sides of the first region I of the first substrate 100 in the second direction D2.

A third region may be further formed to surround the second region II of the first substrate 100, and an upper circuit pattern may be formed to transfer electrical signals to the memory cells through the upper contact plugs.

Hereinafter, region X of FIG. 5, which includes portions of the first and second regions I and II of the first substrate 100 will be explained.

Figure 6:
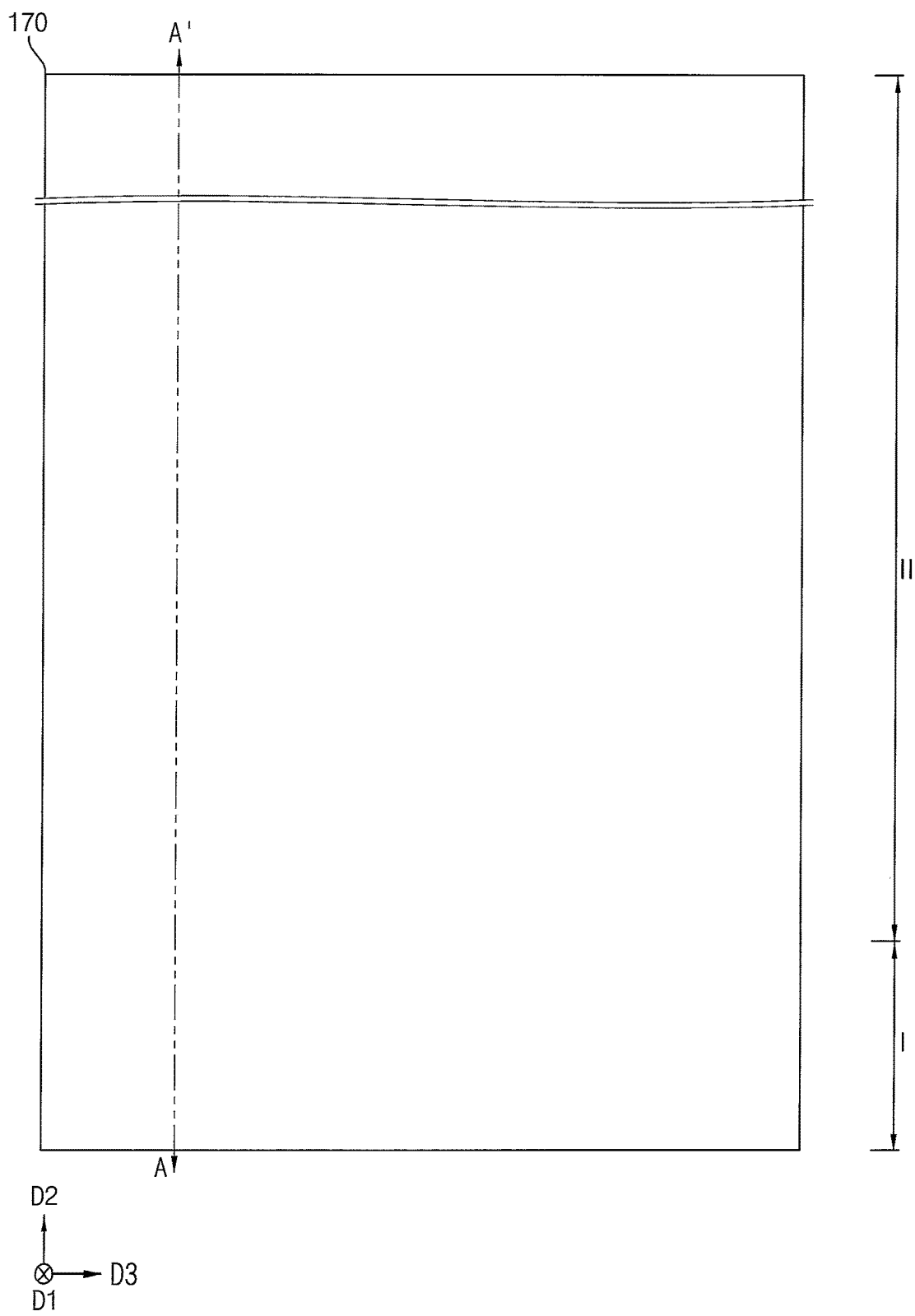
Figure 7:
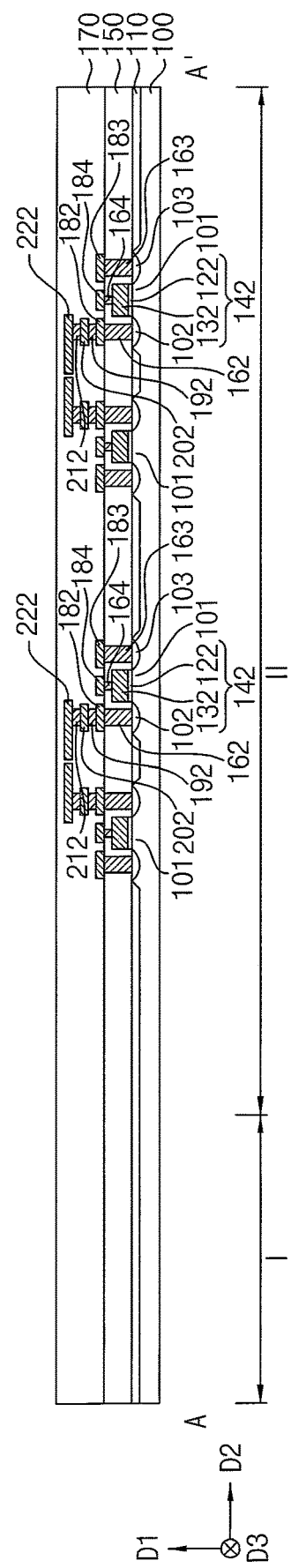

Referring to FIGS. 6 and 7, a lower circuit pattern may be formed on the first substrate 100, and first and second insulating interlayers 150 and 170 may be sequentially formed on the first substrate 100 to cover the lower circuit pattern.

The first substrate 100 may include a field region on which an isolation pattern 110 is formed, and an active region on which no isolation pattern 110 is formed. The isolation pattern 110 may be formed by, e.g., a shallow trench isolation (STI) process, and may include an oxide, e.g., silicon oxide.

In example embodiments, the vertical memory device may have a cell over periphery (COP) structure. That is, the lower circuit pattern may be formed on the first substrate 100, and memory cells, upper contact plugs, and an upper circuit pattern may be formed over the lower circuit pattern.

The lower circuit pattern may include, e.g., transistors, lower contact plugs, lower wirings, lower vias, etc.

Figure 13:
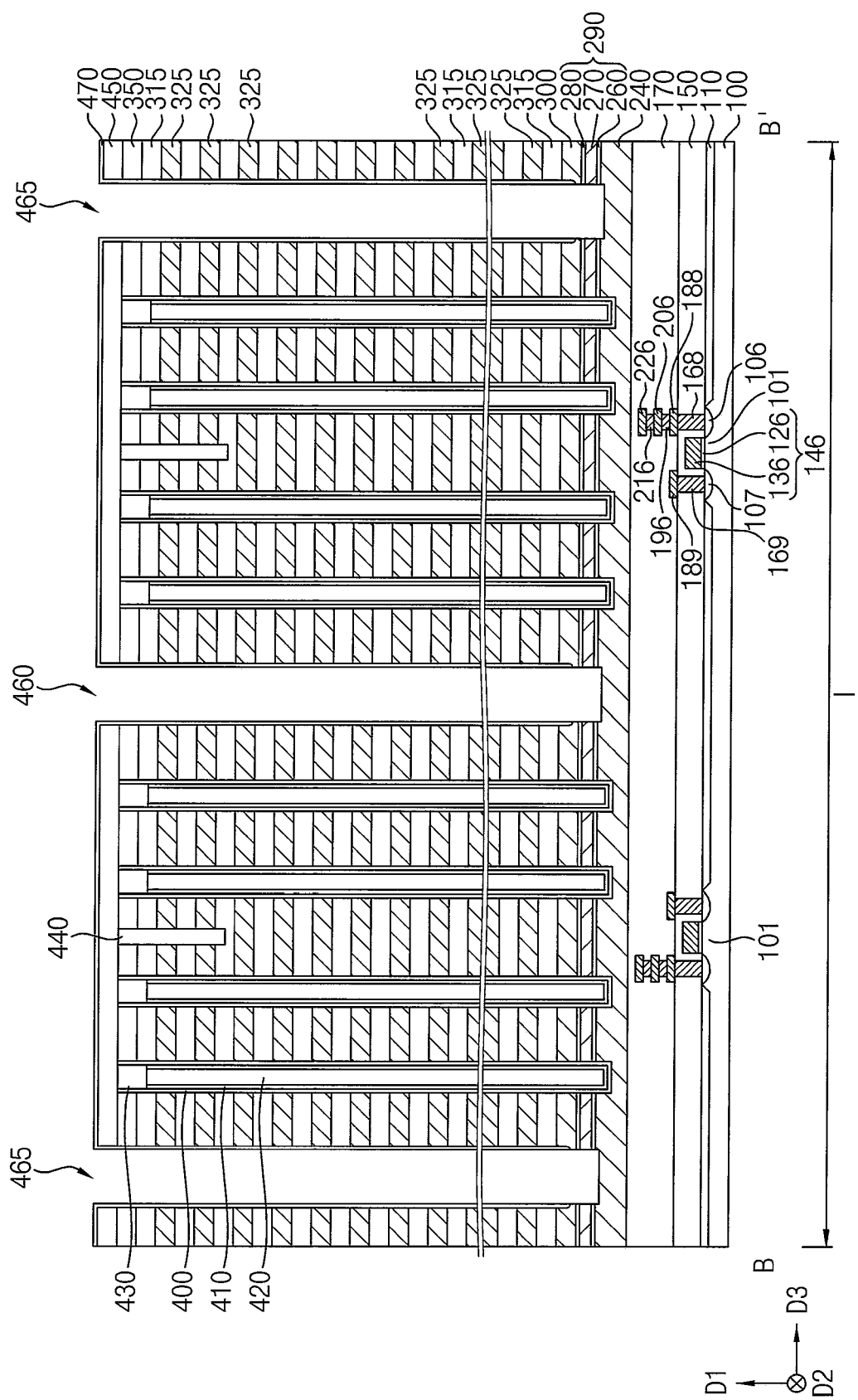

Referring to FIG. 13 together with FIG. 7, first and second transistors may be formed on the second and first regions II and I, respectively, of the first substrate 100. The first transistor may include a first lower gate electrode 142 on the first substrate 100 and first and second impurity regions 102 and 103 serving as source/drains at upper portions of the active region 101 adjacent to the first lower gate electrode 142. The second transistor may include a second lower gate electrode 146 on the first substrate 100 and third and fourth impurity regions 106 and 107 serving as source/drains at upper portions of the active region 101 adjacent to the second lower gate electrode 146.

The first lower gate electrode 142 may include a first lower gate insulation pattern 122 and a first lower gate electrode 132 sequentially stacked on the first substrate 100, and the second lower gate electrode 146 may include a second lower gate insulation pattern 126 and a second lower gate electrode 136 sequentially stacked.

The first insulating interlayer 150 may be formed on the first substrate 100 to cover the first and second transistors. First, second, fourth and fifth lower contact plugs 162, 163, 168 and 169 may extend through the first insulating interlayer 150 to contact the first to fourth impurity regions 102, 103, 106 and 107, respectively, and a third lower contact plug 164 may extend through the first insulating interlayer 150 to contact the first lower gate electrode 132. A sixth lower contact plug may be further formed to extend through the first insulating interlayer 150 to contact the second lower gate electrode 136.

First to fifth lower wirings 182, 183, 184, 188 and 189 may be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may be sequentially stacked on the first lower wiring 182, and a second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150 to cover the first to ninth lower wirings 182, 183, 184, 188, 189, 202, 206, 222 and 226 and the first to fourth lower via 192, 196, 212 and 216.

The elements of the lower circuit pattern may be formed by a patterning process or a damascene process.

Figure 8:
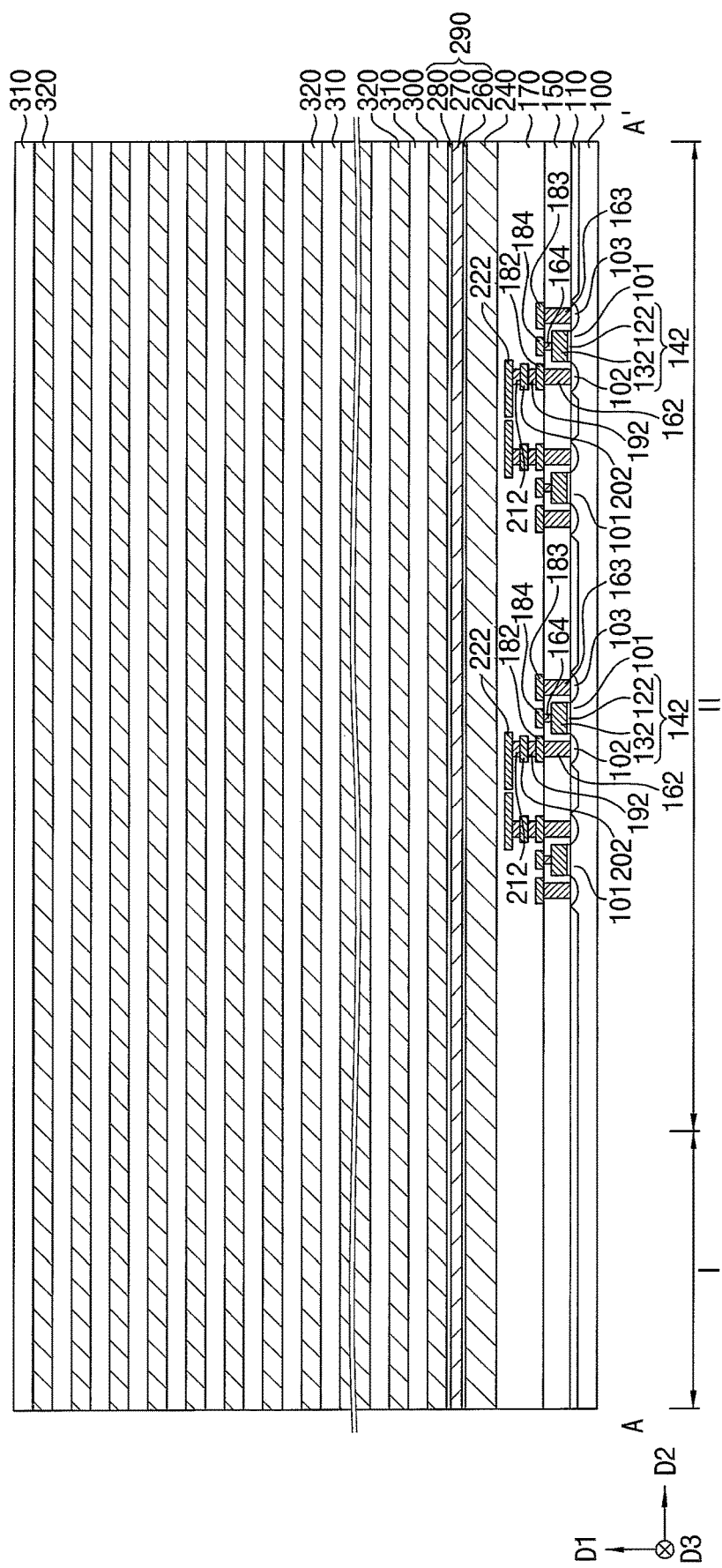

Referring to FIG. 8, a common source plate (CSP) 240, a first sacrificial layer structure 290, and a first support layer 300 may be sequentially formed on the second insulating interlayer 170.

The CSP 240 may include, e.g., polysilicon doped with n-type impurities. Alternatively, the CSP 240 may include a metal silicide layer and a polysilicon layer doped with n-type impurities sequentially stacked. The metal silicide layer may include, e.g., tungsten silicide.

The first sacrificial layer structure 290 may include first to third sacrificial layers 260, 270 and 280 sequentially stacked. Each of the first and third sacrificial layers 260 and 280 may include an oxide, e.g., silicon oxide, and the second sacrificial layer 270 may include a nitride, e.g., silicon nitride.

The first support layer 300 may include a material having an etching selectivity with respect to the first to third sacrificial layers 260, 270 and 280, e.g., polysilicon doped with n-type impurities. In some embodiments, the first support layer 300 may extend through the first sacrificial layer structure 290 to contact an upper surface of the CSP 240, which may form a support pattern.

An insulation layer 310 and a fourth sacrificial layer 320 may be alternately and repeatedly formed on the first support layer 300, and thus a mold layer including the insulation layers 310 and the fourth sacrificial layers 320 may be formed. The insulation layer 310 may include an oxide, e.g., silicon oxide, and the fourth sacrificial layer 320 may include a material having an etching selectivity with respect to the insulation layer 310, e.g., a nitride such as silicon nitride.

Figure 10:
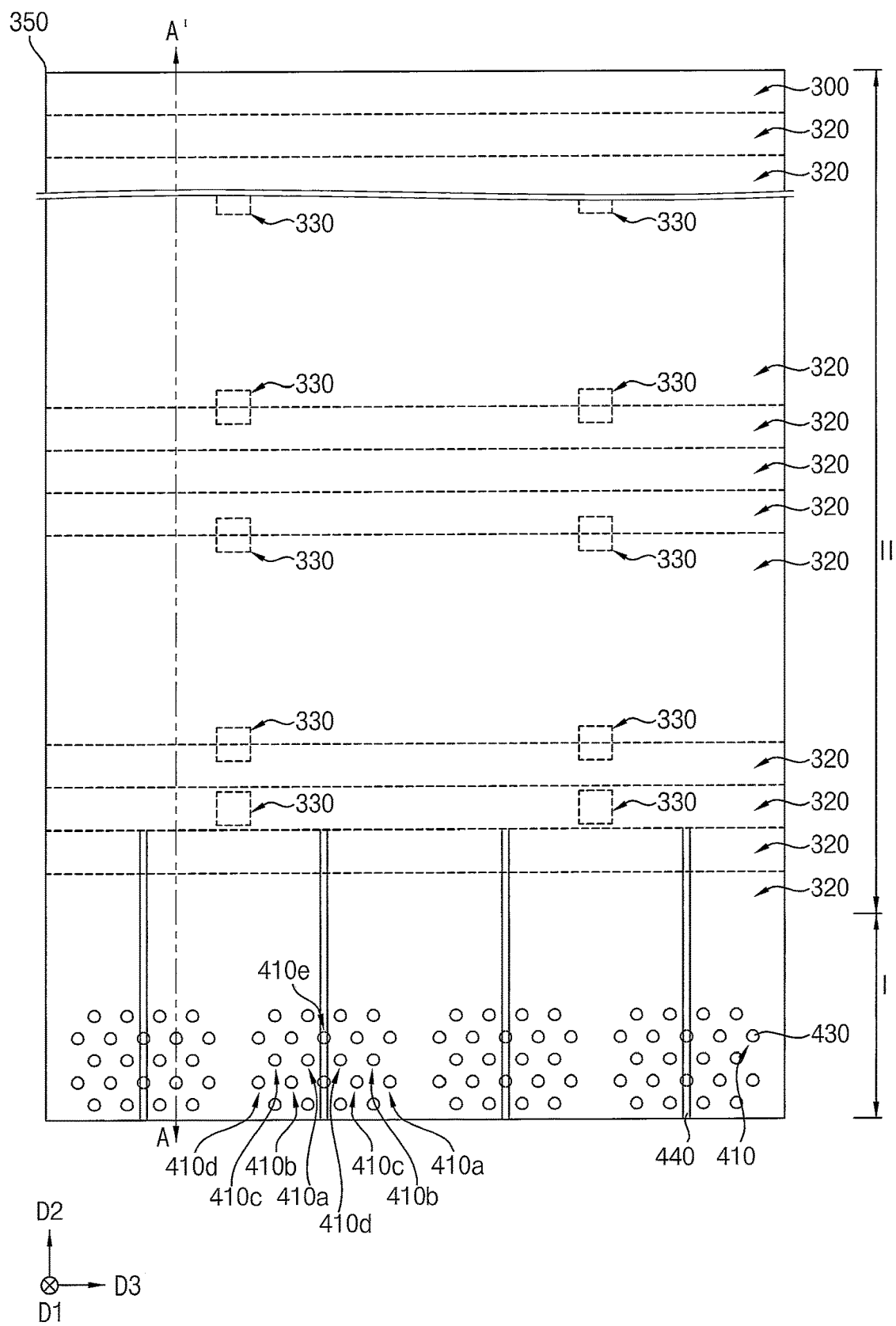

However, referring to FIG. 10 together with FIG. 8, a first division pattern 330 may be formed through a lowermost one of the fourth sacrificial layers 320. The first division pattern 330 may be formed on the second region II of the first substrate 100, and may include an oxide, e.g., silicon oxide. In example embodiments, a plurality of first division patterns 330 may be formed in each of the second and third directions D2 and D3.

Figure 9:
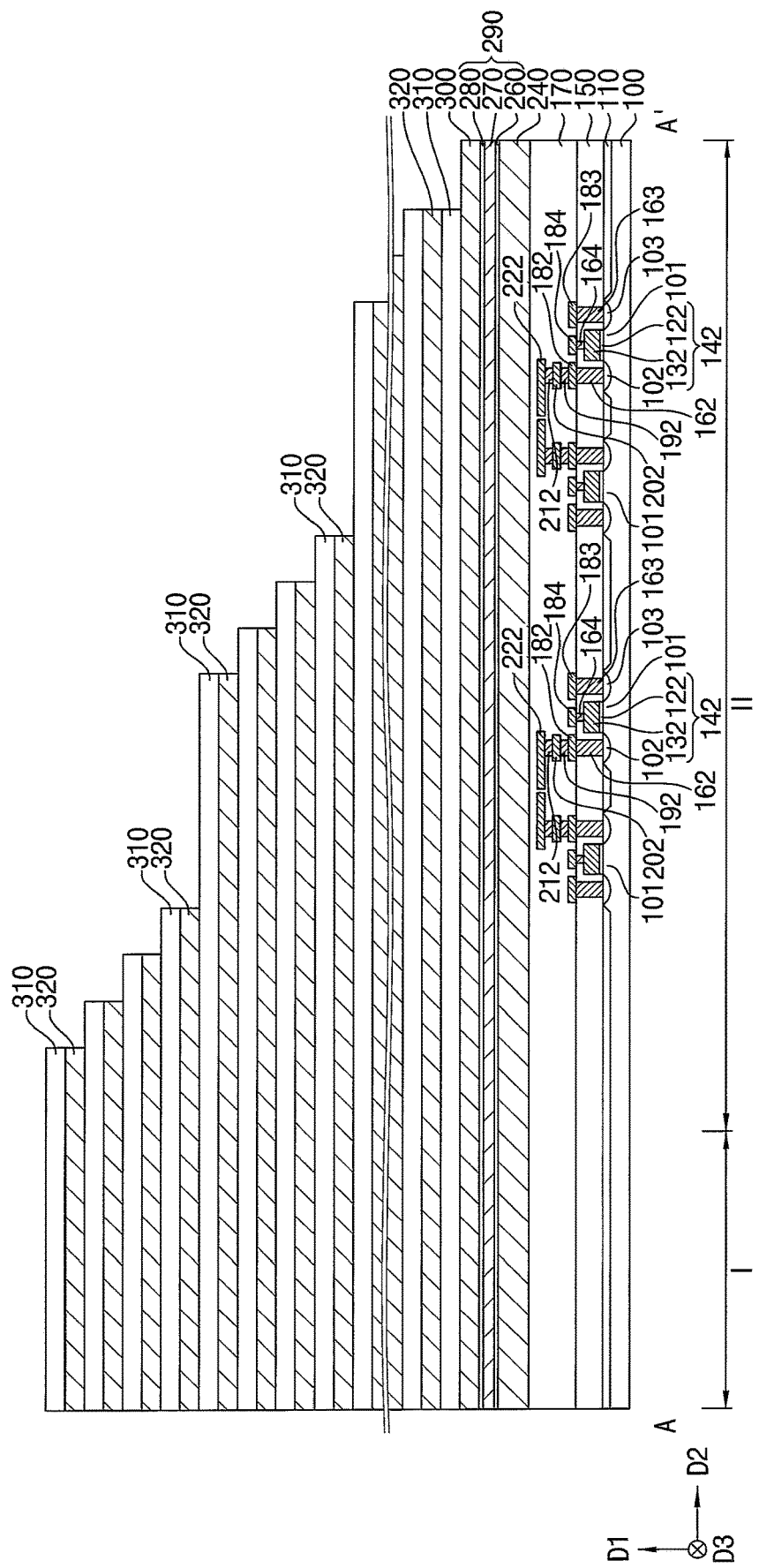

Referring to FIG. 9, after forming a photoresist pattern on an uppermost one of the insulation layers 310, the uppermost one of the insulation layers 310 and an uppermost one of the fourth sacrificial layers 320 may be etched using the photoresist pattern as an etching mask. Thus, one of the insulation layers 310 directly under the uppermost one of the fourth sacrificial layers 320 may be partially exposed.

A trimming process for reducing an area of the photoresist pattern may be performed, and the uppermost one of the insulation layers 310, the uppermost one of the fourth sacrificial layers 320, the partially exposed one of the insulation layers 310, and one of the fourth sacrificial layers 320 directly thereunder may be etched using the reduced photoresist pattern as an etching mask. The trimming process and the etching process may be alternately and repeatedly performed to form a mold having a plurality of step layers, e.g., patterned as a staircase with a plurality of descending steps, each including one of the fourth sacrificial layers 320 and one of the insulation layers 310 sequentially stacked and having a staircase shape.

Hereinafter, the "step layer" may be referred to as an entire portion of the fourth sacrificial layer 320 and the insulation layer 310 at the respective same level including an exposed portion and non-exposed portion thereof, and the exposed portion of the step layer that is not covered by upper step layers to be exposed may be defined as a "step." In example embodiments, a plurality of steps may be arranged in the second direction D2. Alternatively, a plurality of steps may also be arranged in the third direction D3.

In example embodiments, lengths in the second direction D2 of the steps of the mold may be constant except for some steps. The steps having different lengths in the second direction D2 may be longer than other steps in the second direction D2. Hereinafter, ones of the steps having a relatively short length in the second direction D2 may be referred to as first steps, and other ones of the steps having a relatively long length in the second direction D2 may be referred to as second steps. FIG. 9 shows two second steps. In each plan view after FIG. 10, the steps are indicated by dotted lines.

The mold may be formed on the first support layer 300 on the first and second regions I and II of the first substrate 100, and an end portion of the first support layer 300 may not be covered by the mold but exposed. Each step of the mold may be formed on the second region II of the first substrate 100.

Figure 11A:
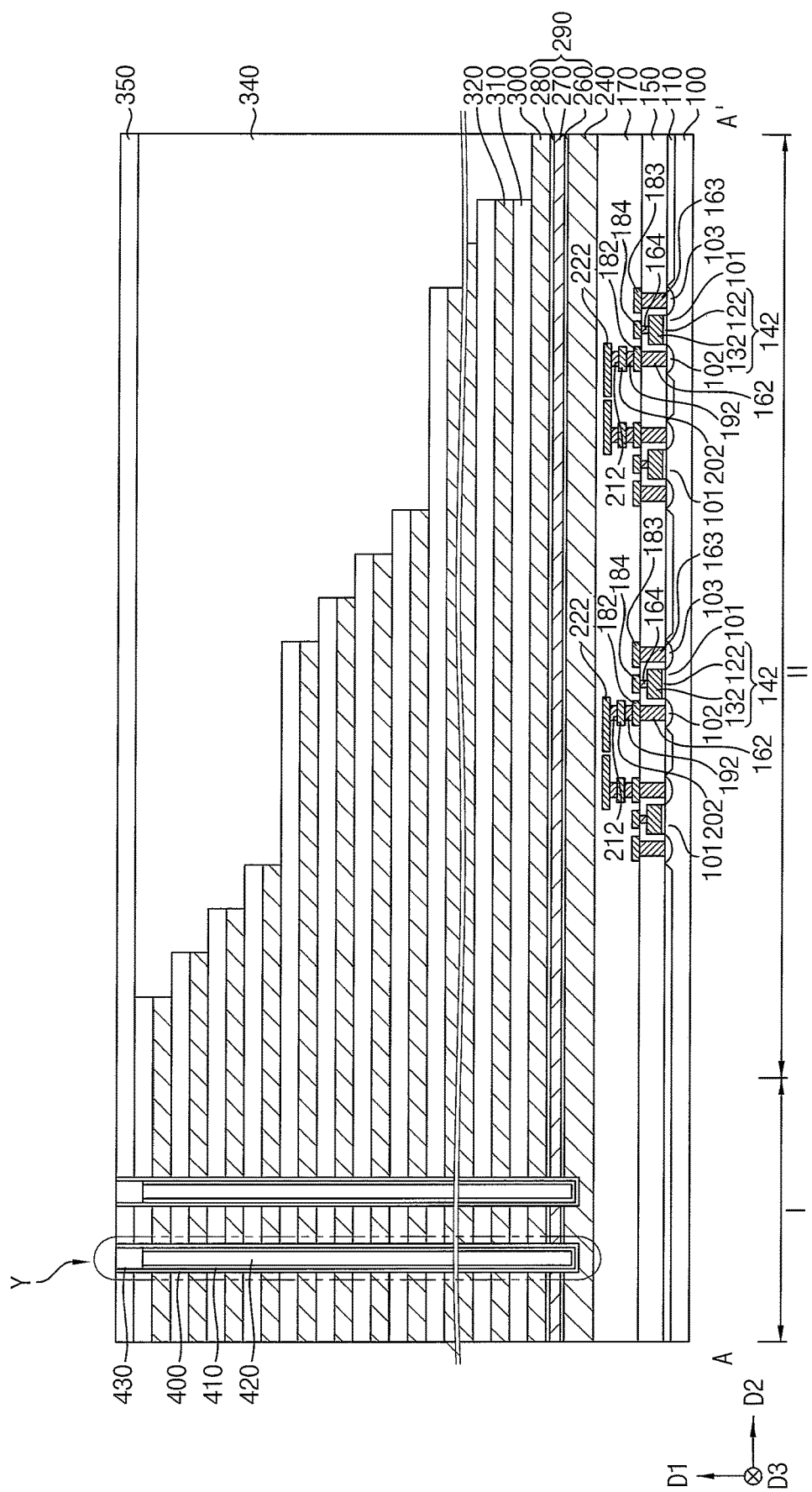
Figure 11B:
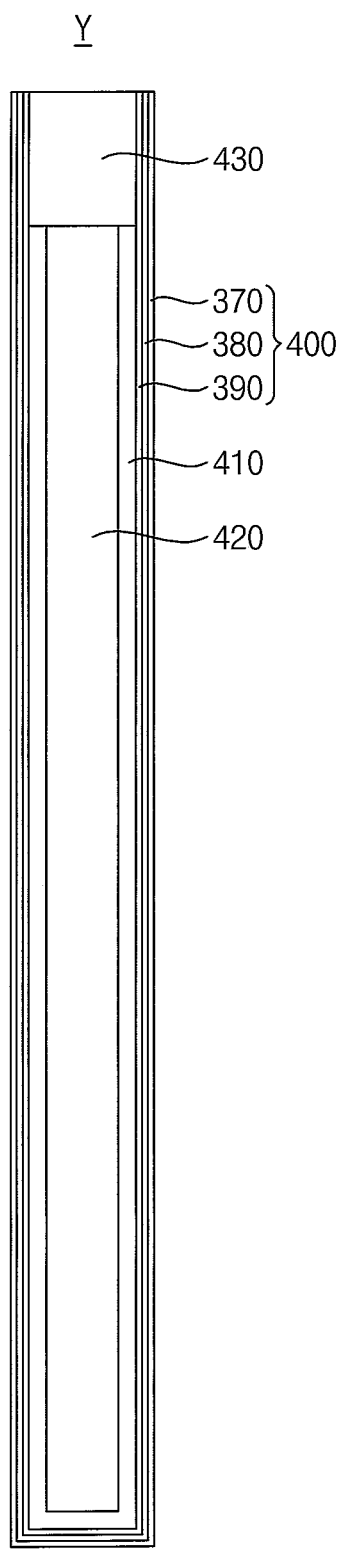

Referring to FIGS. 10, 11A and 11B, a third insulating interlayer 340 may be formed on the CSP 240 to cover the mold and an upper surface of the exposed portion of the first support layer 300, and may be planarized until an upper surface of the uppermost one of the insulation layers 310 is exposed. Thus, a sidewall of the mold may be covered by the third insulating interlayer 340. A fourth insulating interlayer 350 may be formed on the mold and the third insulating interlayer 340.

A channel hole may be formed through the fourth insulating interlayer 350, the mold, the first support layer 300, and the first sacrificial layer structure 290 to expose an upper surface of a portion of the CSP 240 on the first region I of the first substrate 100. In example embodiments, a plurality of channel holes may be formed in each of the second and third directions D2 and D3.

A charge storage structure layer and a channel layer may be sequentially formed on a sidewall of each of the channel holes, the exposed upper surface of the CSP 240, and an upper surface of the fourth insulating interlayer 350, and a filling layer may be formed on the channel layer to fill the channel holes. The filling layer, the channel layer and the charge storage structure layer may be planarized until the upper surface of the fourth insulating interlayer 350 is exposed to form a charge storage structure 400, a channel 410 and a filling pattern 420 in each of the channel holes. Each of the charge storage structure 400, the channel 410, and the filling pattern 420 may extend in the first direction D1.

In example embodiments, the charge storage structure 400 may include a tunnel insulation pattern 390, a charge storage pattern 380, and a first blocking pattern 370 sequentially stacked in a horizontal direction substantially parallel to the upper surface of the first substrate 100 from an outer sidewall of the channel 410. The tunnel insulation pattern 390 and the first blocking pattern 370 may include an oxide, e.g., silicon oxide, the charge storage pattern 380 may include a nitride, e.g., silicon nitride, and the filling pattern 420 may include an oxide, e.g., silicon oxide.

A first trench may be formed by removing upper portions of the filling pattern 420 and the channel 410. After forming a capping layer filling the first trench on the filling pattern 420, the channel 410, the charge storage structure 400, and the fourth insulating interlayer 350, an upper portion of the capping layer may be planarized until the upper surface of the fourth insulating interlayer 350 is exposed to form a capping pattern 430. In example embodiments, the capping pattern 430 may be formed of, e.g., polysilicon or amorphous silicon doped with impurities. When the capping pattern 430 includes amorphous silicon, a process of crystallizing amorphous silicon may be additionally performed.

The filling pattern 420, the channel 410, the charge storage structure 400, and the capping pattern 430 together may form a memory channel structure 435. The memory channel structure 435 may correspond to the memory channel structures 3220 and 4220 shown in FIGS. 3 and 4, respectively.

In example embodiments, a plurality of channels 410 may be formed in each of the second and third directions D2 and D3, which may form a channel array. In example embodiments, the channel array may have a primary channel column 410A including a plurality of channels 410 arranged in the second direction D2, and a secondary channel column 410B including a plurality of channels 410 arranged in the second direction D2 and being spaced apart from the primary channel column 410A in the third direction D3. The channels 410 of the secondary channel column 410B may be located at an oblique, e.g., acute, angle with respect to the channels 410 of the primary channel column 410A in the second direction D2 or in the third direction D3.

The primary and secondary channel columns 410A and 410B may be alternately and repeatedly arranged in the third direction D3. In example embodiments, five (5) primary channel columns 410A and four (4) secondary channel columns 410B may be alternately arranged in the third direction D3, which may form a channel group. Hereinafter, four (4) channel columns in the channel group may be referred to as first, second, third and fourth channel columns 410a, 410b, 410c and 410d, respectively, in the third direction D3, a central channel columns in the channel group may be referred to as a fifth channel column 410e, and other four (4) channel columns in the channel group may be referred to as the first, second, third and fourth channel columns 410a, 410b, 410c and 410d, respectively, again in the third direction D3.

Two (2) channel groups arranged in the third direction D3 may form a channel block. A plurality of memory cells including the channels 410, the charge storage structures 400, and gate electrodes illustrated below may also form a memory group and a memory block, which may correspond to the channel group and the channel block, respectively. An erase operation in the semiconductor device may be performed using the memory block as a unit. FIG. 10 shows two (2) memory blocks arranged in the third direction D3, and each memory block may include two (2) memory groups arranged in the third direction D3.

The fourth insulating interlayer 350, some of the insulation layers 310, and some of the fourth sacrificial layers 320 may be etched to form a first opening extending therethrough in the second direction D2, and a second division pattern 440 may be formed to fill the first opening.

In an example embodiment, the second division pattern 440 may extend through upper portions of some of the channels 410, particularly, ones of the channels 410 included in the fifth channel column 410e of each channel group. In example embodiments, the second division pattern 440 may extend through not only the upper portions of the ones of the channels 410 but also the fourth insulating interlayer 350, upper two fourth sacrificial layers 320, upper two insulation layers 310, and a portion of one of the insulation layers 310 directly thereunder. The second division pattern 440 may extend in the second direction D2 on the first and second regions I and II of the first substrate 100, and may extend through two upper steps of the mold. Thus, two upper fourth sacrificial layers 320 may be divided in the third direction D3 by the second division pattern 440.

Figure 12:
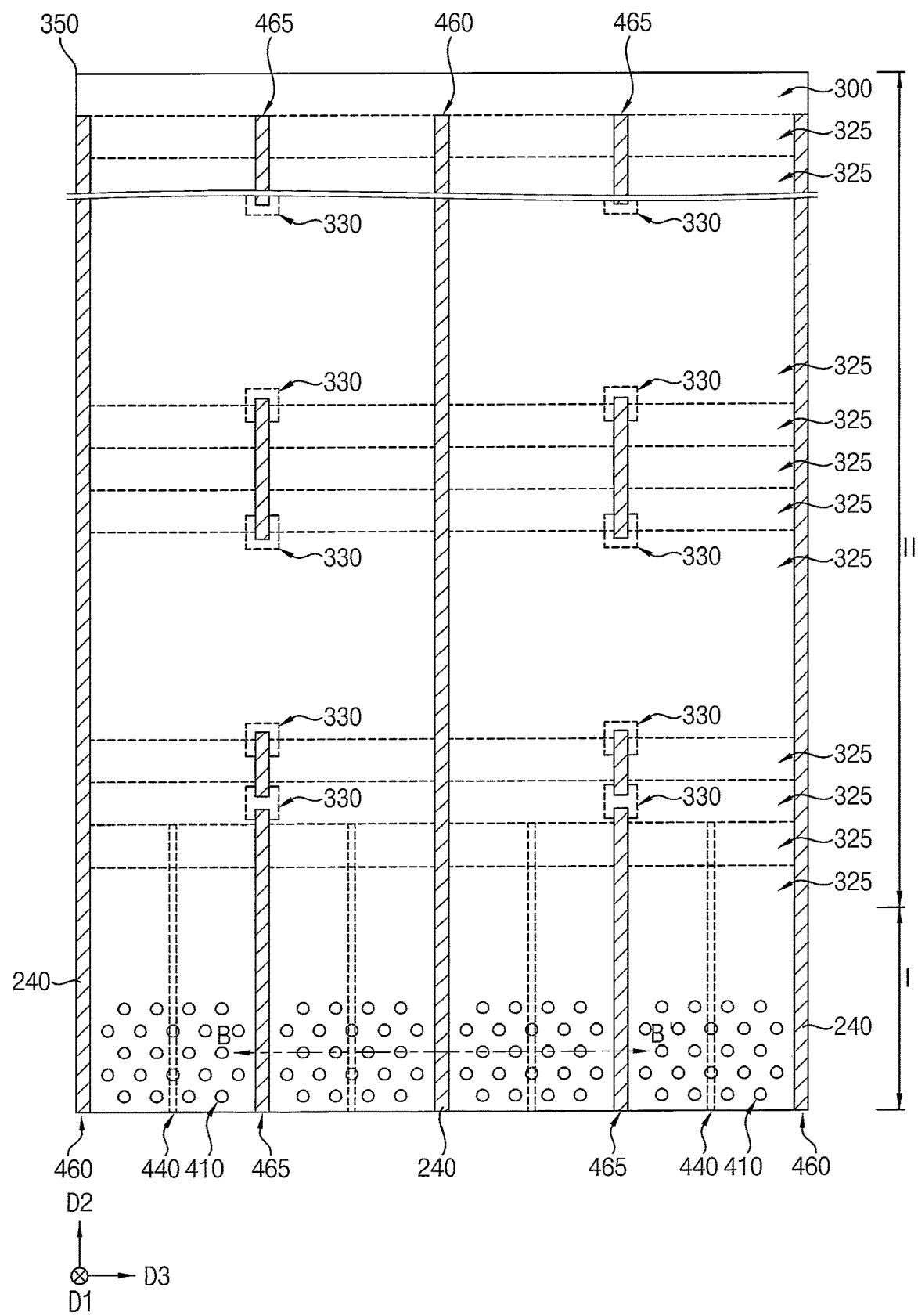

Referring to FIGS. 12 and 13, a fifth insulating interlayer 450 may be formed on the fourth insulating interlayer 350, the capping pattern 430, and the second division pattern 440, and second to fourth openings 460, 465 and 467 may be formed through the third to fifth insulating interlayers 340, 350 and 450 and the mold.

In example embodiments, the second opening 460 may extend in the second direction D2 on the first and second regions I and II of the first substrate 100 to opposite ends in the second direction D2 of the mold having the staircase shape, and a plurality of second openings 460 may be spaced apart from each other in the third direction D3. Thus, the mold may be divided into a plurality of parts in the third direction D3 by the second openings 460. In an example embodiment, each of the second openings 460 may be formed between the memory blocks. That is, the memory blocks may be spaced apart from each other in the third direction D3 by the second openings 460.

As the second opening 460 is formed, the insulation layers 310 and the fourth sacrificial layers 320 included in the mold may be transformed into first insulation patterns 315 and fourth sacrificial patterns 325, respectively.

In example embodiments, the third opening 465 may be formed to extend in the second direction D2 on the first region I of the first substrate 100, however, a plurality of third openings 465 may be spaced apart from each other in the second direction D2 on the second region II of the first substrate 100. The third openings 465 arranged in the second direction D2 may be formed between ones of the second openings 460 neighboring in the third direction D3. In an example embodiment, the third openings 465 may be formed between memory groups included in each of the memory blocks spaced apart from each other by the second openings 460. That is, the memory groups may be spaced apart from each other in the third direction D3 by the third openings 465 in each memory block.

However, unlike the second opening 460 extending to opposite ends in the second direction D2 of the mold, the third openings 465 may be spaced apart from each other in the second direction D2. Thus, the memory groups included in each memory block may not be entirely divided by the third openings 465.

In example embodiments, each portion of the mold between ones of the third openings 465 neighboring in the second direction D2 may overlap the first division pattern 330 in the first direction D1. Accordingly, the fourth sacrificial pattern 325 formed at a lowermost level of each mold between the second openings 460 may be separated from each other in the third direction D3 by the first division pattern 330 and the third opening 465 extending in the second direction D2 on the first and second regions I and II of the first substrate 100.

Each of the third openings 465 may continuously extend in the second direction D2 on the first region I of the first substrate 100, and may extend to opposite ends of the two upper steps of the mold on the second region II of the first substrate 100. Thus, ones of the fourth sacrificial patterns 325 at two upper levels, respectively, may be divided in the third direction D3 by the third opening 465 and the second division patterns 440 at opposite sides, respectively, of the third opening 465 in the second direction D2.

In example embodiments, the etching process may be performed until the second and third openings 460 and 465 expose an upper surface of the first support layer 300, and further extend through an upper portion of the first support layer 300.

A first spacer layer may be formed on sidewalls of the second and third openings 460 and 465 and the fifth insulating interlayer 450, and may be anisotropically etched to remove portions of the first spacer layer on bottoms of the second and third openings 460 and 465, so that a first spacer 470 may be formed and that an upper surface of the first support layer 300 may be partially exposed.

The exposed portion of the first support layer 300 and a portion of the first sacrificial layer structure 290 thereunder may be removed to enlarge each of the second and third openings 460 and 465 downwardly. Thus, the second and third openings 460 and 465 may expose an upper surface of CSP 240, and further extend through an upper portion of the CSP 240.

In example embodiments, the first spacer 470 may include undoped polysilicon. When the first sacrificial layer structure 290 is partially removed, the sidewalls of the second and third openings 460 and 465 may be covered by the first spacer 470, so that the first insulation patterns 315 and the fourth sacrificial patterns 325 of the mold may not be removed.

Figure 14:
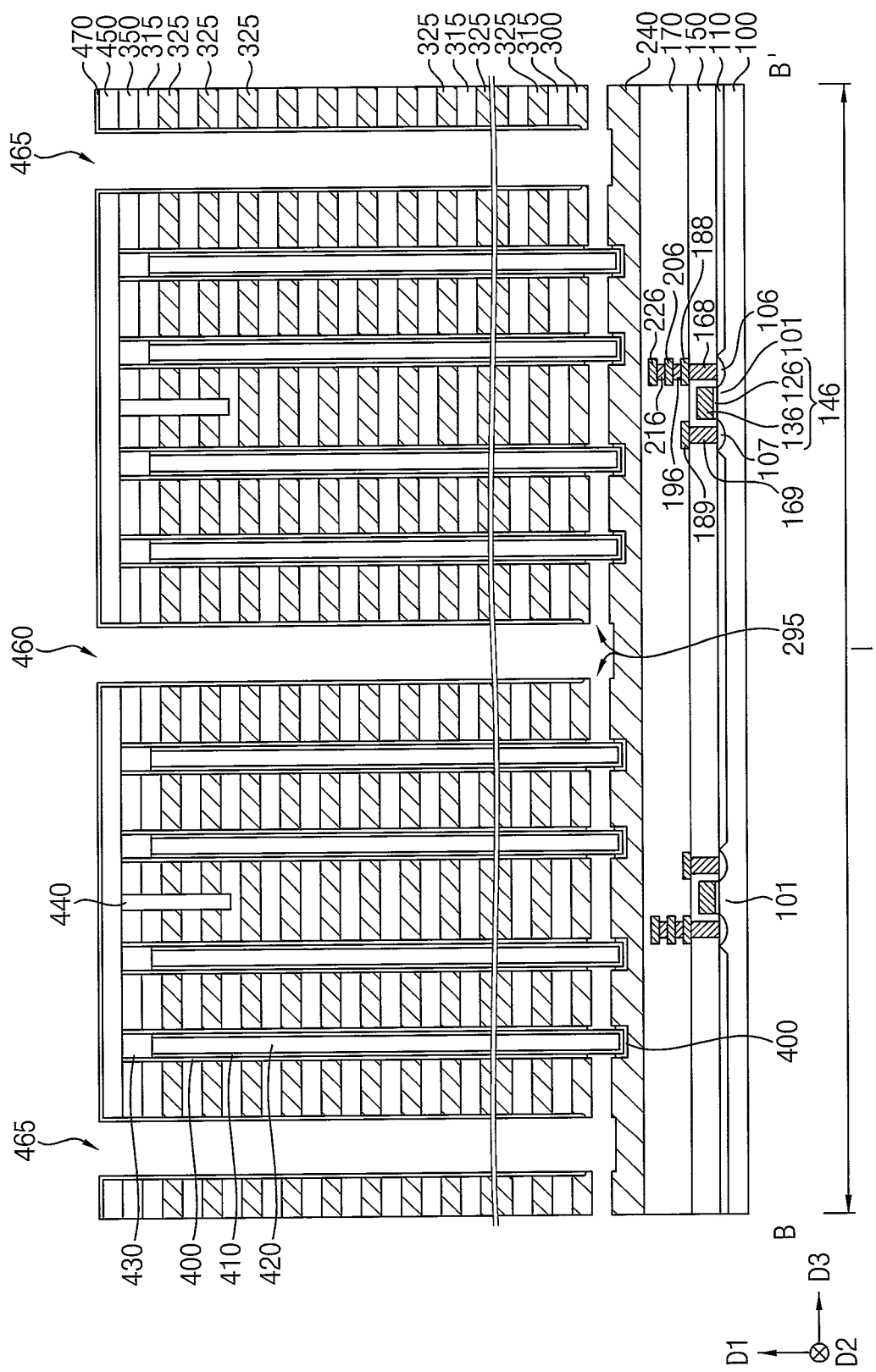

Referring to FIG. 14, the first sacrificial layer structure 290 exposed by the second and third openings 460 and 465 may be removed, e.g., by a wet etching process, to form a first gap 295. The wet etching process may be performed using, e.g., hydrofluoric acid or phosphoric acid.

As the first gap 295 is formed, a lower surface of the first support layer 300 and an upper surface of the CSP 240 may be exposed. Additionally, a portion of a sidewall of the charge storage structure 400 may be exposed by the first gap 295, and the exposed portion of the sidewall of the charge storage structure 400 may also be removed during the wet etching process to expose an outer sidewall of the channel 410. Accordingly, the charge storage structure 400 may be divided into an upper portion extending through the mold and covering most of the outer sidewall of the channel 410, and a lower portion covering a bottom surface of the channel 410 on the CSP 240.

Figure 15:
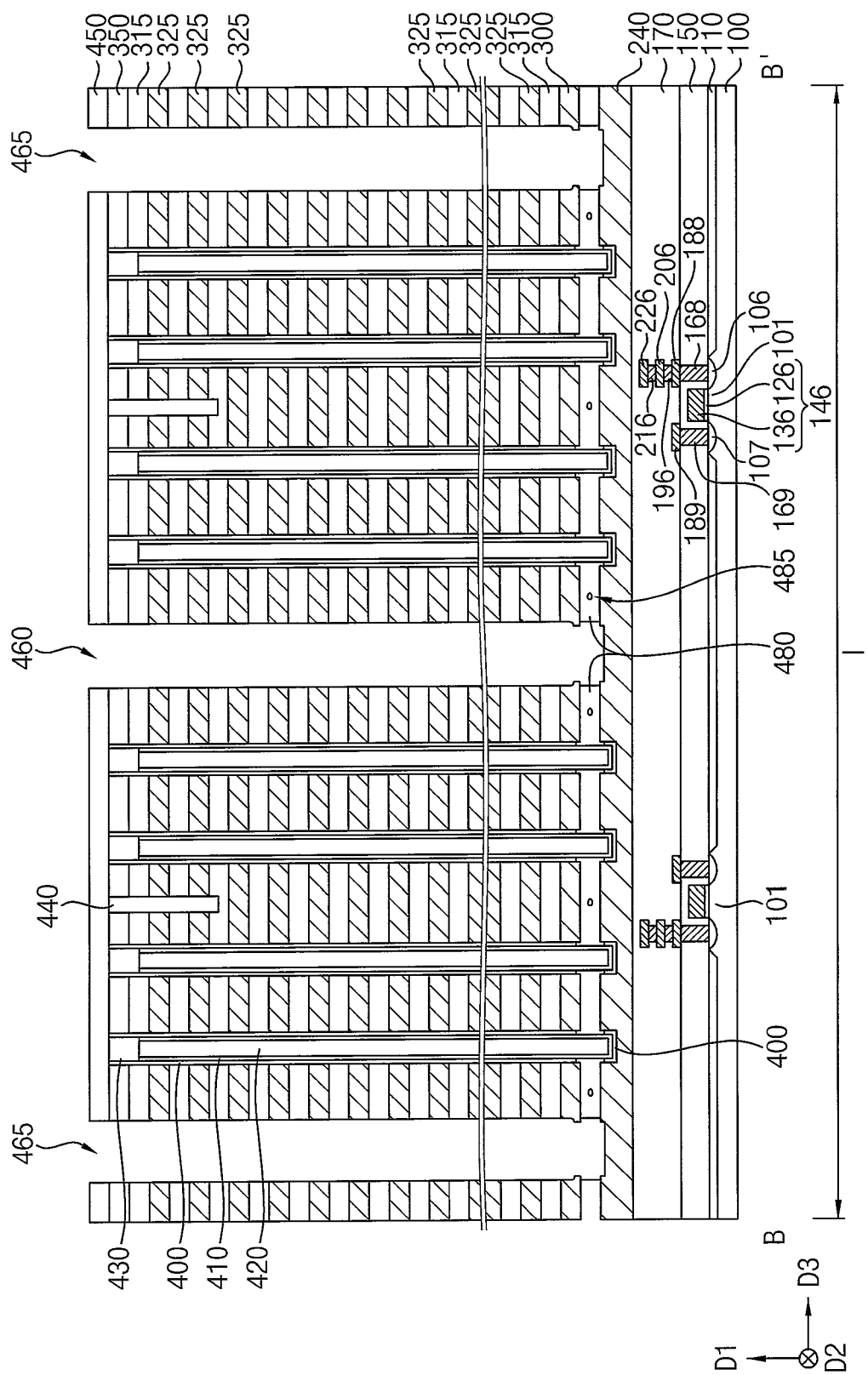

Referring to FIG. 15, the first spacer 470 may be removed, a channel connection layer may be formed on the sidewalls of the second and third openings 460 and 465, and in the first gap 295, and for example, an etch back process or a wet etching process may be performed to remove portions of the channel connection layer in the second and third openings 460 and 465, so that a channel connection pattern 480 may be formed in the first gap 295.

As the channel connection pattern 480 is formed, the channels 410 between ones of the second and third openings 460 and 465 neighboring in the third direction D3, i.e., the channels 410 in each channel group, may be connected with each other. The channel connection pattern 480 may include, e.g., polysilicon doped with n-type impurities or undoped polysilicon. An air gap 485 may be formed in the channel connection pattern 480.

Figure 16:
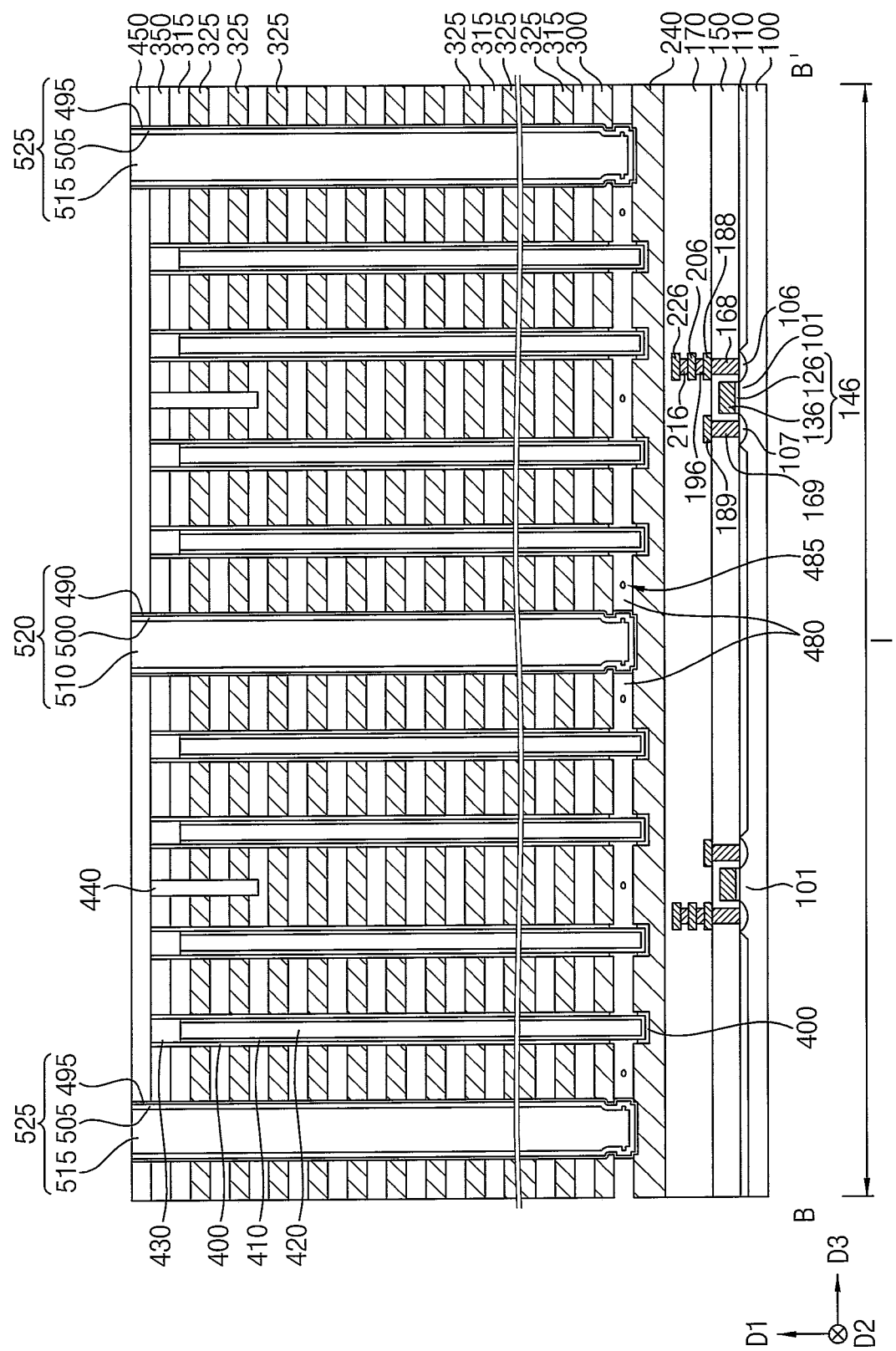

Referring to FIG. 16, second and third sacrificial layer structures 520 and 525 may be formed in the second and third and fourth openings 460 and 465, respectively. The second and third sacrificial layer structures 520 and 525 may be formed by sequentially forming an etch stop layer and a second spacer layer on the sidewalls of the second and third openings 460 and 465, and the exposed upper surface of the CSP 240, forming a fifth sacrificial layer on the second spacer layer to fill the second and third openings 460 and 465, and planarizing the fifth sacrificial layer, the second spacer layer, and the etch stop layer until an upper surface of the fifth insulating interlayer 450 is exposed.

The second sacrificial layer structure 520 may include a first etch stop pattern 490, a second spacer 500, and a fifth sacrificial pattern 510 sequentially stacked. The third sacrificial layer structure 525 may include a second etch stop pattern 495, a third spacer 505, and a sixth sacrificial pattern 515 sequentially stacked.

The first and second etch stop patterns may include a material having an etching selectivity with respect to the fourth sacrificial pattern 325, e.g., an oxide such as silicon oxide. The second and third spacers may include a nitride, e.g., silicon nitride, and the fifth and sixth sacrificial patterns may include, e.g., polysilicon, or an oxide such as silicon oxide.

Figure 17:
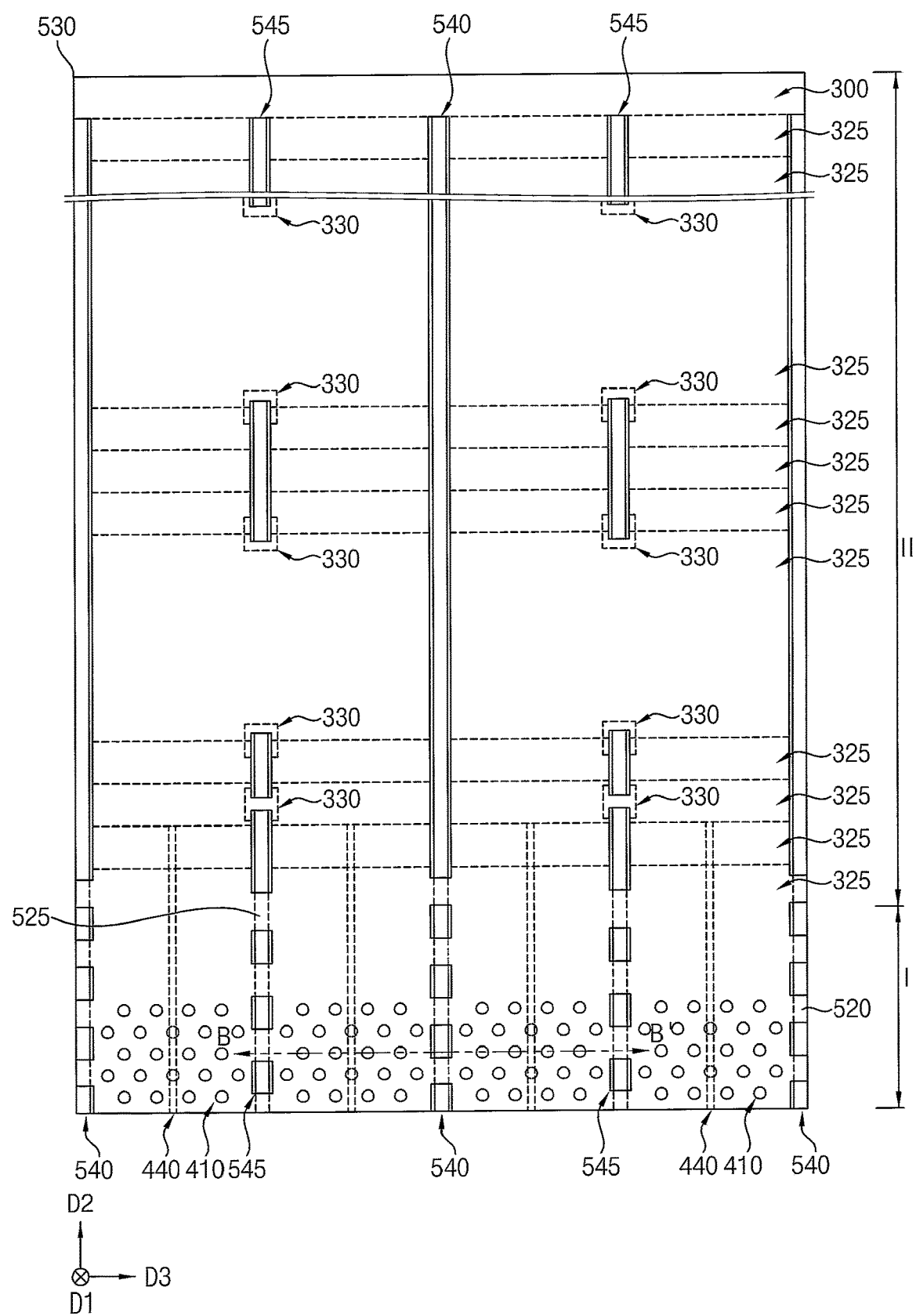
Figure 18:
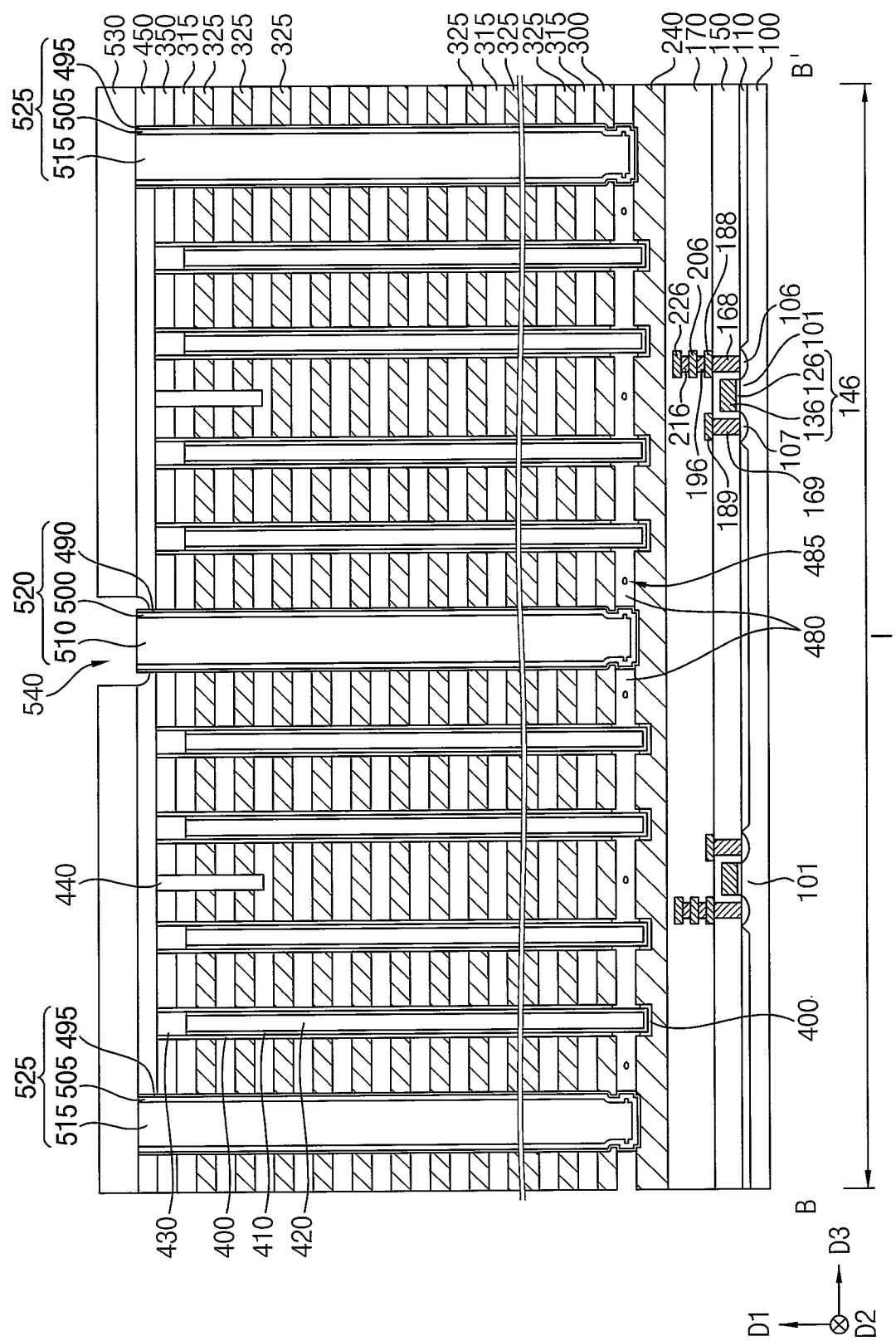

Referring to FIGS. 17 and 18, a second support layer 530 may be formed on the fifth insulating interlayer 450 and the second and third sacrificial layer structures 520 and 525, and may be partially etched to form fourth and fifth openings 540 and 545. The second support layer 530 may include an oxide, e.g., silicon oxide.

For example, the second support layer 530 may be formed to, e.g., continuously, cover the top of the entire structure of FIG. 16, e.g., continuously cover tops of the fifth insulating interlayer 450 and the second and third sacrificial layer structures 520 and 525, followed by etching the second support layer 530 to form the fourth and fifth opening 540 and 545 over the second and third sacrificial layer structures 520 and 525, respectively. For example, as illustrated in FIG. 17, the fourth and fifth opening 540 and 545 may be discontinuous, e.g., discrete, openings through the second support layer 530 that are spaced apart from each other, while the second support layer 530 may extend continuously around the fourth and fifth opening 540 and 545.

In detail, the fourth opening 540 may overlap the second sacrificial layer structure 520 in the first direction D1, e.g., the fourth opening 540 may be on top of the second sacrificial layer structure 520 to expose the second sacrificial layer structure 520. As illustrated in FIG. 17, the fourth opening 540 may extend in the second direction D2 on the second region II of the first substrate 100, e.g., the fourth opening 540 may extend continuously in the second direction D2 on the entire second region II of the first substrate 100. As further illustrated in FIG. 17, a plurality of fourth openings 540 may be spaced apart from each other in the second direction D2 on the same second sacrificial layer structure 520 on the first region I of the first substrate 100. In an example embodiment, the fourth opening 540 may have a width in the third direction D3 greater than that of the second sacrificial layer structure 520, however, embodiments are not limited thereto.

In example embodiments, the fifth opening 545 may overlap the third sacrificial layer structure 525 in the first direction D1. Thus, a plurality of fifth openings 545 may be spaced apart from each other in the second direction D2 on the second region II of the first substrate 100. Additionally, a plurality of fifth openings 545 may be spaced apart from each other in the second direction D2 on the same third sacrificial layer structure 525 on the first region I of the first substrate 100. In an example embodiment, the fifth opening 545 may have a width in the third direction D3 greater than that of the third sacrificial layer structure 525, however, embodiments are not limited thereto.

In example embodiments, the fourth and fifth openings 540 and 545 may be arranged in a zigzag pattern in the second direction D2 on the first region I of the first substrate 100, e.g., the fourth and fifth openings 540 and 545 may be misaligned with respect to each other along the second direction D2 to define the zigzag pattern (e.g., in a top view). The fourth and fifth openings 540 and 545 may partially overlap each other in the third direction D3, e.g., as viewed in a top view.

Figure 19:
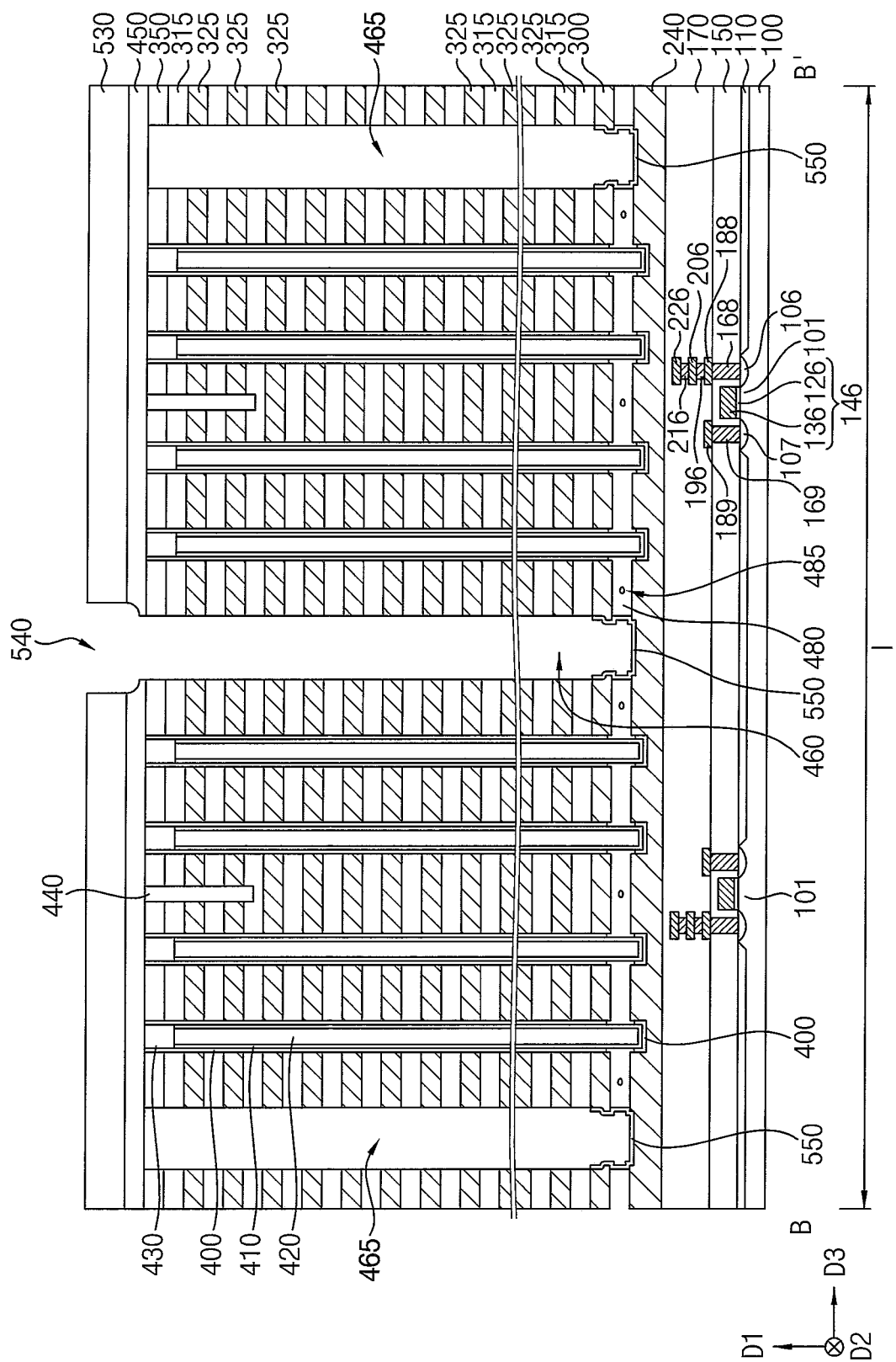

Referring to FIG. 19, the second and third sacrificial layer structures 520 and 525 may be removed through the fourth and fifth openings 540 and 545. Thus, the second and third openings 460 and 465 may be formed again. For example, the second and third sacrificial layer structures 520 and 525 may be removed by a wet etching process.

As discussed above, the fourth and fifth openings 540 and 545 may not entirely cover, e.g., only partially cover, upper surfaces of the second and third sacrificial layer structures 520 and 525 at least on the first region I of the first substrate 100. For example, referring back to FIG. 17, the fourth openings 540 may be spaced apart from each other along the same second sacrificial layer structure 520 in the first region I, e.g., so portions of the second sacrificial layer structure 520 between adjacent ones of the fourth openings 540 may not be covered by the fourth openings 540, and the fifth openings 545 may be spaced apart from each other along the same third sacrificial layer structure 525 in the first region I, e.g., so portions of the third sacrificial layer structure 525 between adjacent ones of the fifth openings 545 may not be covered by the fifth openings 545.

Thus, even though the second and third openings 460 and 465 are formed again, e.g., in regions where the second and third sacrificial layer structures 520 and 525 are removed, the tops of the second and third openings 460 and 465, i.e., upper surfaces of the second and third sacrificial layer structures 520 and 525, may be at least partially covered, e.g., by portions of the second support layer 530 between adjacent ones of the fourth and fifth openings 540 and 545. Accordingly, even though a height of an upper surface of the mold and a length in the second direction D2 of the mold are great, the mold may not lean or fall down in the third direction D3 in the first region I because of the second support layer 530, e.g., which may extend continuously over the entire mold to support the mold around the fourth and fifth openings 540 and 545.

The fourth and fifth openings 540 and 545 may entirely expose upper surfaces of the second and third sacrificial layer structures 520 and 525 on the second region II of the first substrate 100, and thus, the second support layer 530 may not cover an area where the second and third openings 460 and 465 are formed. However, since a plurality of the third openings 465 may be formed to be spaced apart from each other along the second direction D2 in the second region II, and the second support layer 530 may extend in the second direction D2 therebetween, the mold may not lean or fall down in the third direction D3 in the second region II.

An oxidation process may be performed on layers including silicon exposed by the second and third openings 460 and 465 to form a protection layer 550. In example embodiments, the protection layer 550 may be formed on the upper surface of the CSP 240 exposed by the second and third openings 460 and 465, a sidewall of the channel connection pattern 480, and a sidewall of the first support layer 300. The protection layer 550 may include, e.g., silicon oxide.

Figure 20:
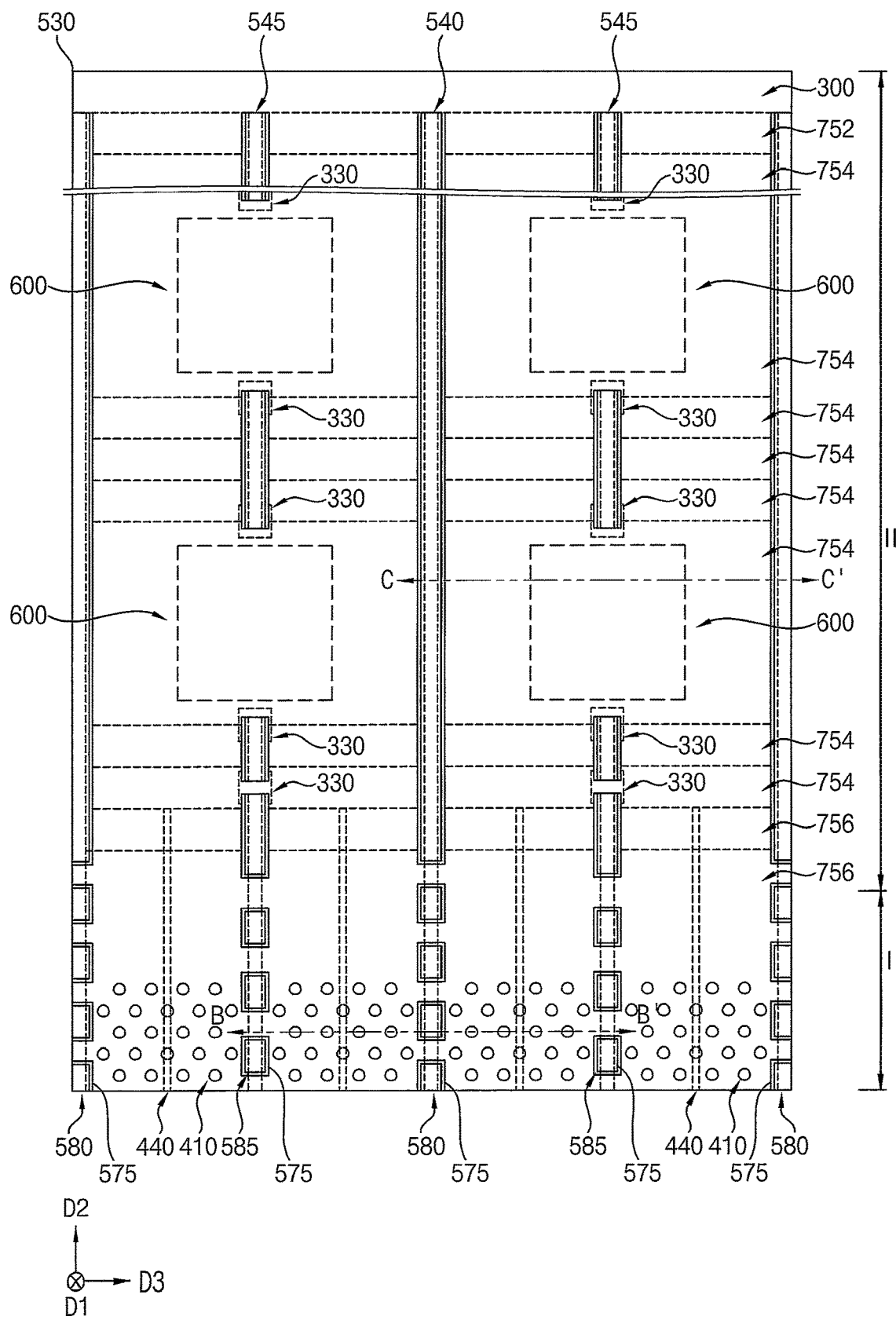
Figure 21:
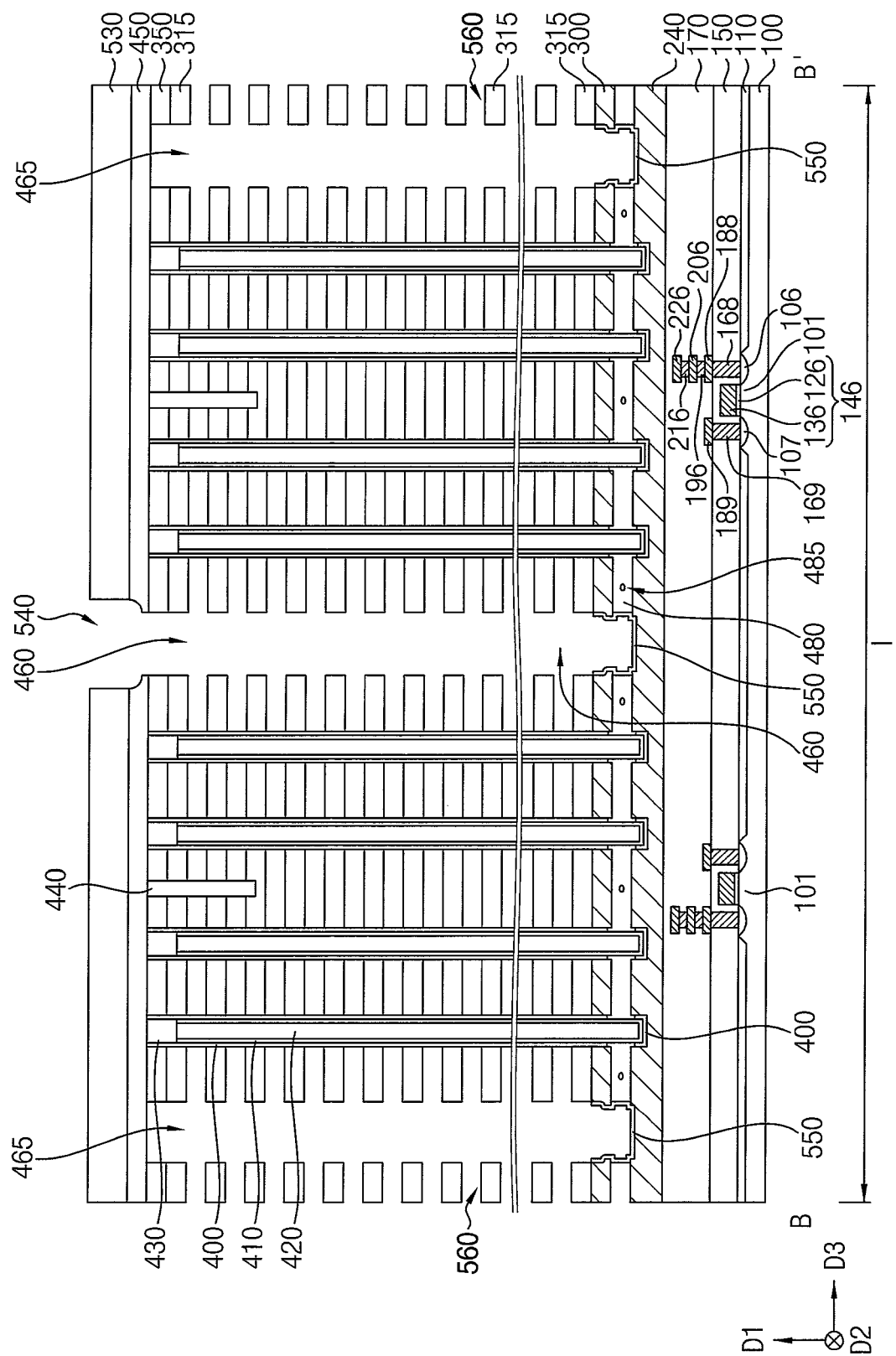
Figure 22:
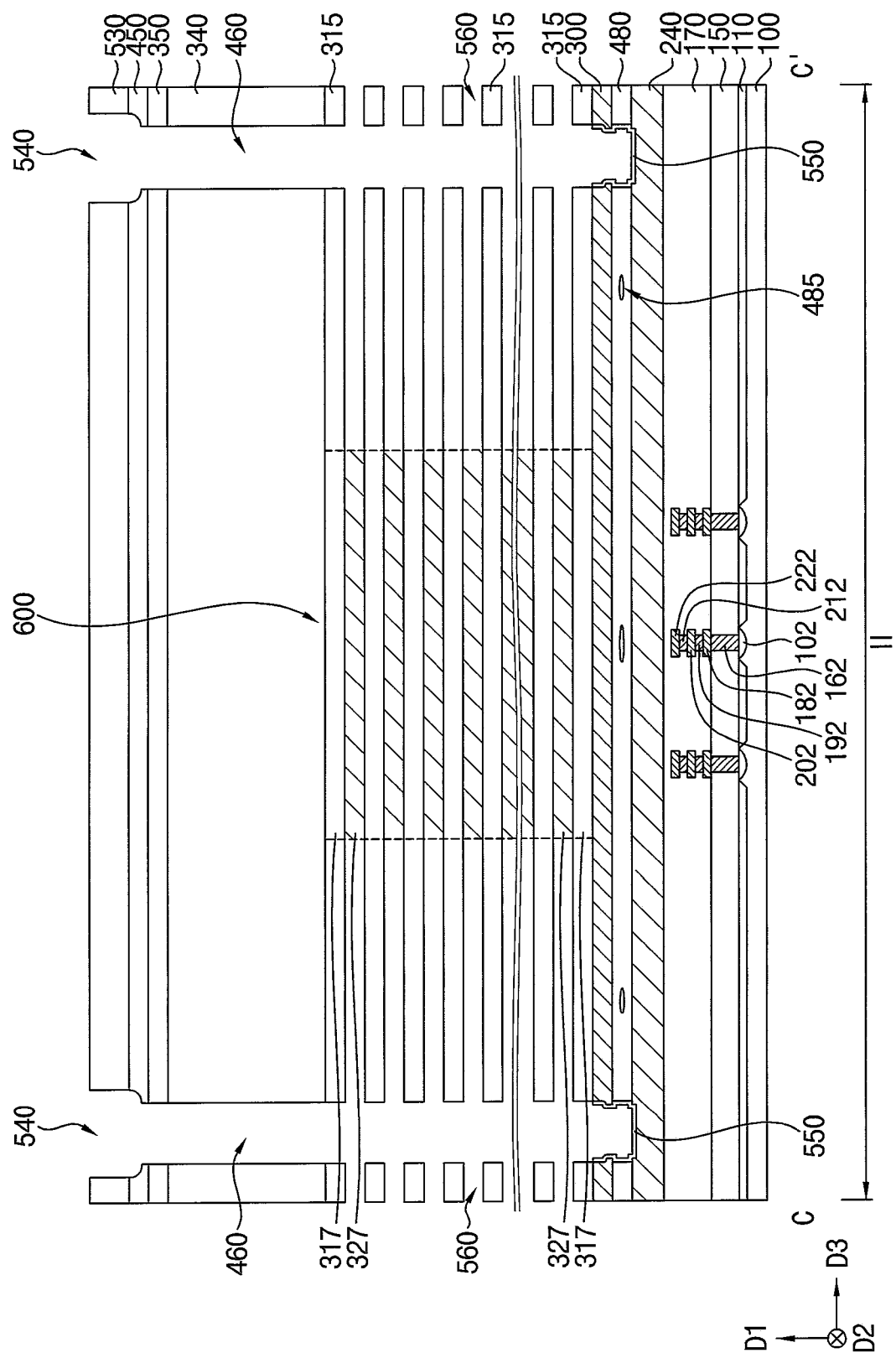

Referring to FIGS. 20 to 22, the fourth sacrificial patterns 325 exposed by the second and third openings 460 and 465 may be removed to form a second gap 560 between the first insulation patterns 315 at respective levels, and a portion of an outer sidewall of the charge storage structure 400 may be exposed by the second gap 560. In example embodiments, the fourth sacrificial patterns 325 may be removed by a wet etching process using phosphoric acid or sulfuric acid.

The wet etching process may be performed through the second and third openings 460 and 465, and the fourth sacrificial pattern 325 may be entirely removed by an etching solution provided in both directions from the second and third openings 460 and 465. However, the etching solution may be provided in one direction from the second opening 460 at an area where the third opening 465 is not formed between the second openings 460 on the second region II of the first substrate 100, so that the fourth sacrificial pattern 325 may remain without being removed, and the remaining fourth sacrificial pattern 325 may be referred to as a third insulation pattern 327. A portion of the first insulation pattern 315 overlapping the third insulation patterns 327 in the first direction D1 may be referred to as a second insulation pattern 317. The second and third insulation patterns 317 and 327 alternately and repeatedly formed along the first direction D1 may form an insulation pattern structure 600 together.

That is, the insulation pattern structure 600 may extend through a portion of the mold on the second region II of the first substrate 100 and may have a shape of, e.g., a rectangle, an ellipse, or a circle when viewed from above. In example embodiments, the insulation pattern structure 600 may extend through the second step having a relatively great length in the second direction D2 in each of the molds.

Figure 23:
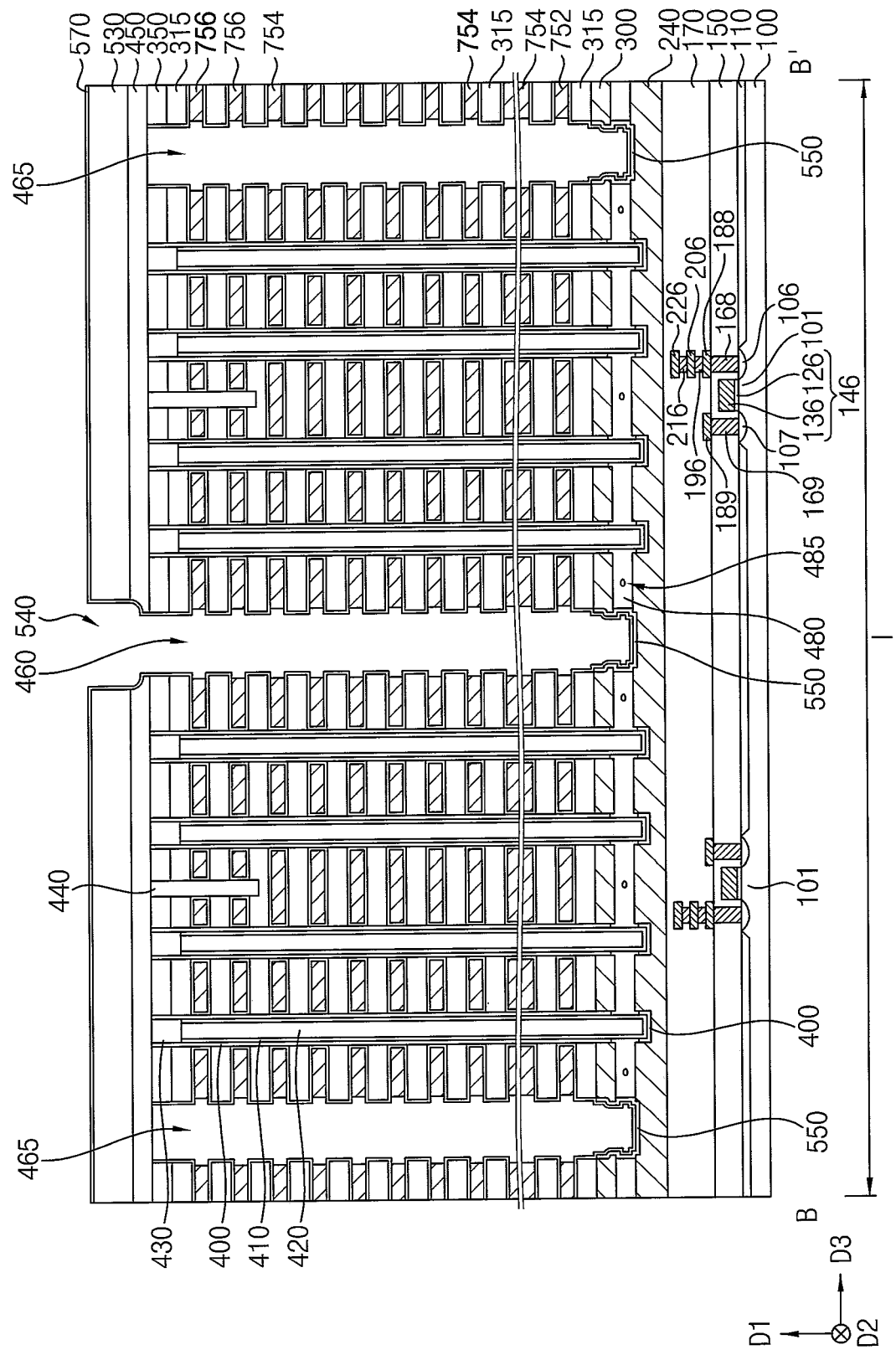
Figure 24:
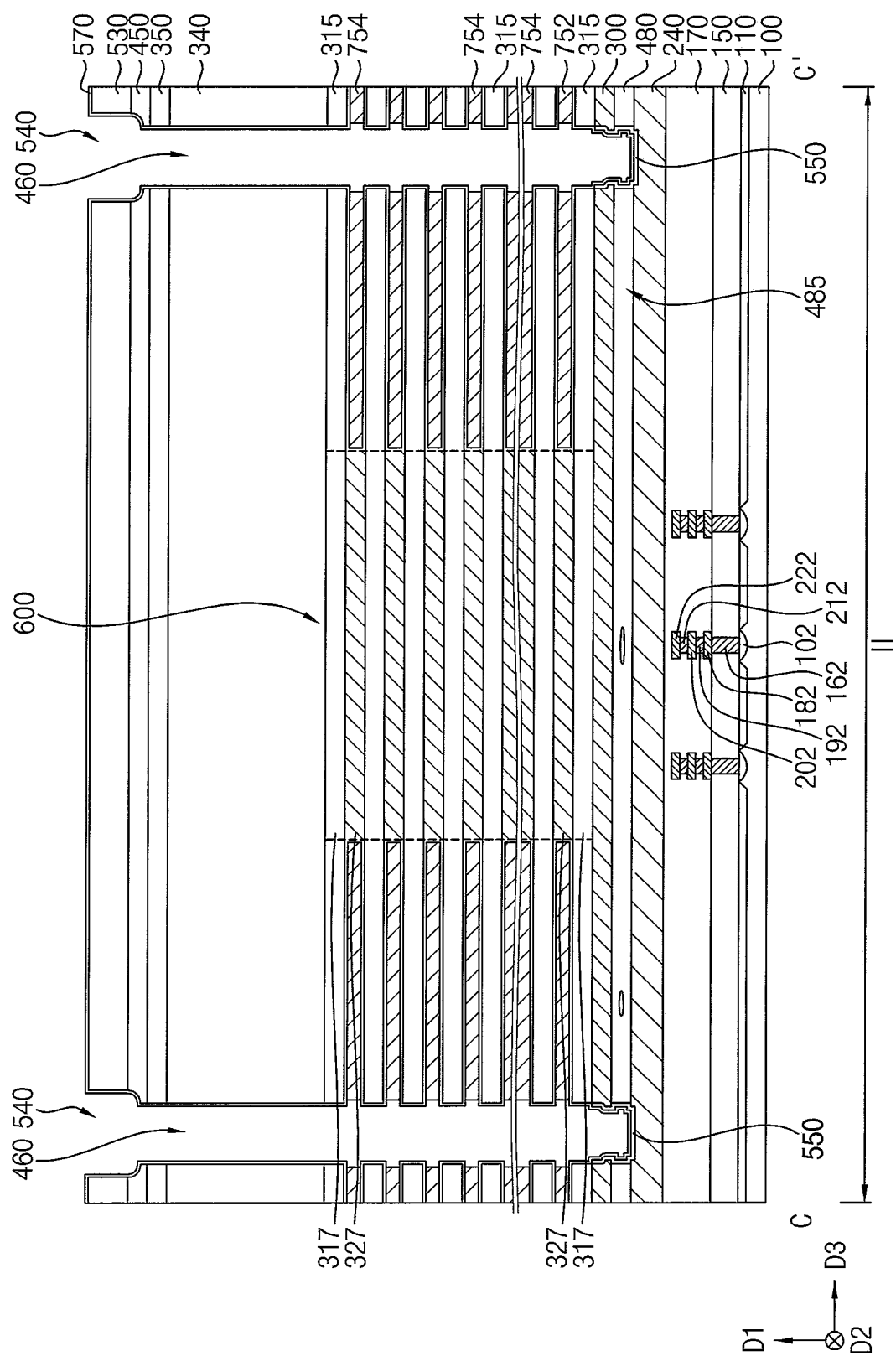

Referring to FIGS. 23 and 24, a second blocking layer 570 may be formed on the exposed portion of the outer sidewall of the charge storage structure 400, inner walls of the second gaps 560, surfaces of the first insulation patterns 315, an upper surface of the protection layer 550, a sidewall and a portion of an upper surface of the fifth insulating interlayer 450, and a sidewall and an upper surface of the second support layer 530, and a gate electrode layer may be formed on the second blocking layer 570.

The gate electrode layer may include a gate barrier layer and a gate conductive layer sequentially stacked. The gate barrier layer may include a metal nitride, and the gate conductive layer may include a metal. The second blocking layer 570 may include a metal oxide, e.g., aluminum oxide, hafnium oxide, etc.

In example embodiments, when the fourth sacrificial pattern 325 including nitride is replaced with the gate electrode layer including a metal and a metal nitride, the mold may shrink in the first direction D1. Accordingly, a height difference may occur between an upper surface of a portion of the second support layer 530 on the insulation pattern structure 600 including the third insulation pattern 327 which is not replaced by the gate electrode layer and an upper surface of a portion of the second support layer 530 on the mold including the gate electrode layer. The height difference may cause cracks in a portion of the second support layer 530 which partially covers an area where openings are formed. However, the second support layer 530 may not cover the area where the second and third openings 460 and 465 are formed on the second region II of the first substrate 100 where the insulation pattern structure 600 is formed. Thus, even though the height difference occurs, cracks may not occur in a portion of the second support layer 530 adjacent to the area where the second and third openings 460 and 465 are formed.

The gate electrode layer may be partially removed to form a gate electrode in each of the second gaps 560. In example embodiments, the gate electrode layer may be partially removed by a wet etching process. As a result, the fourth sacrificial pattern 325 in the mold having a staircase shape including the fourth sacrificial pattern 325 and the first insulation pattern 315 as a step may be replaced with the gate electrode and the second blocking layer 570 covering lower and upper surfaces of the gate electrode.

In example embodiments, the gate electrode may extend in the second direction D2, and a plurality of gate electrodes may be stacked in the first direction D1 to form a gate electrode structure. The gate electrode structure may have a staircase shape including step layers of the gate electrodes. An end portion in the second direction D2 of each of the gate electrodes that may not be overlapped by upper gate electrodes in the first direction D1, i.e., a portion of each of the gate electrodes corresponding to a step of the step layers, may be referred to as a pad. The gate electrode structure may include first pads having a relatively short length in the second direction D2 and second pads having a relatively large length in the second direction D2, and the number of the first and second pads may not be limited.

Additionally, a plurality of gate electrode structures may be formed in the third direction D3, and may be spaced apart from each other by the second openings 460. As illustrated above, the third openings 465 may not extend to ends of the gate electrode structure in the second direction D2, and may be spaced apart from each other in the second direction D2, and thus the gate electrode structure may not be entirely divided by the third openings 465. However, a lowermost one of the gate electrodes in the gate electrode structure may be divided in the third direction D3 by the third openings 465 and the first division pattern 330, and ones of the gate electrodes in the gate electrode structure at upper two levels, respectively, may be divided in the third direction D3 by the third opening 465 and by the second division pattern 440.

The gate electrode structure may include first, second and third gate electrodes 752, 754 and 756 sequentially stacked in the first direction D1. In example embodiments, the first gate electrode 752 may be formed at a lowermost level, and may serve as a ground selection line (GSL). The third gate electrode 756 may be formed at an uppermost level and a second level from above, and may serve as a string selection line (SSL). The second gate electrode 754 may be formed at a plurality of levels between the first and third gate electrodes 752 and 756, and may serve as a word line. In example embodiments, each memory block between ones of the second openings 460 neighboring in the second direction D2 may include two GSLs at each level, one word line at each level, and four SSLs at each level.

Figure 25:
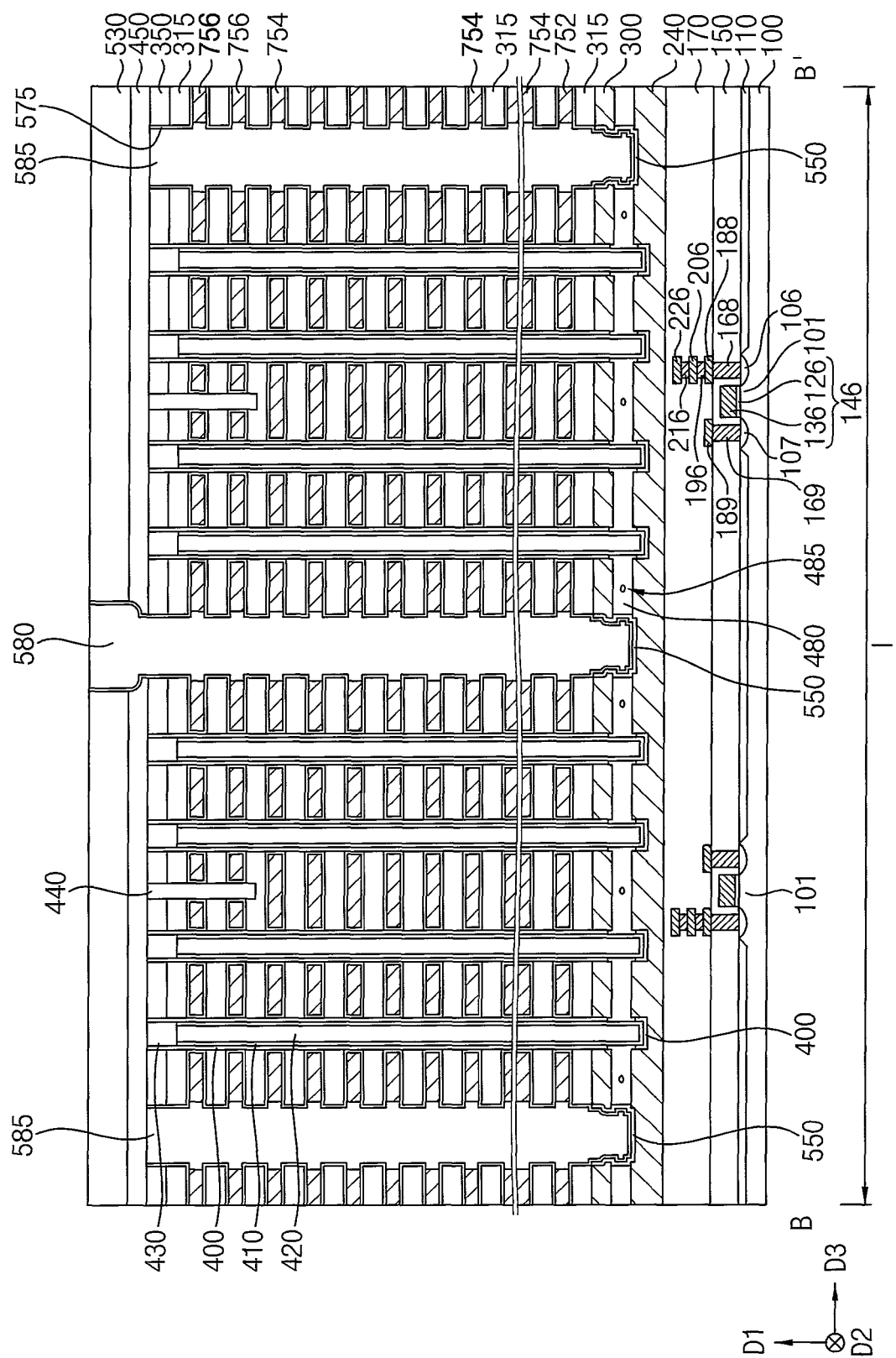
Figure 26:
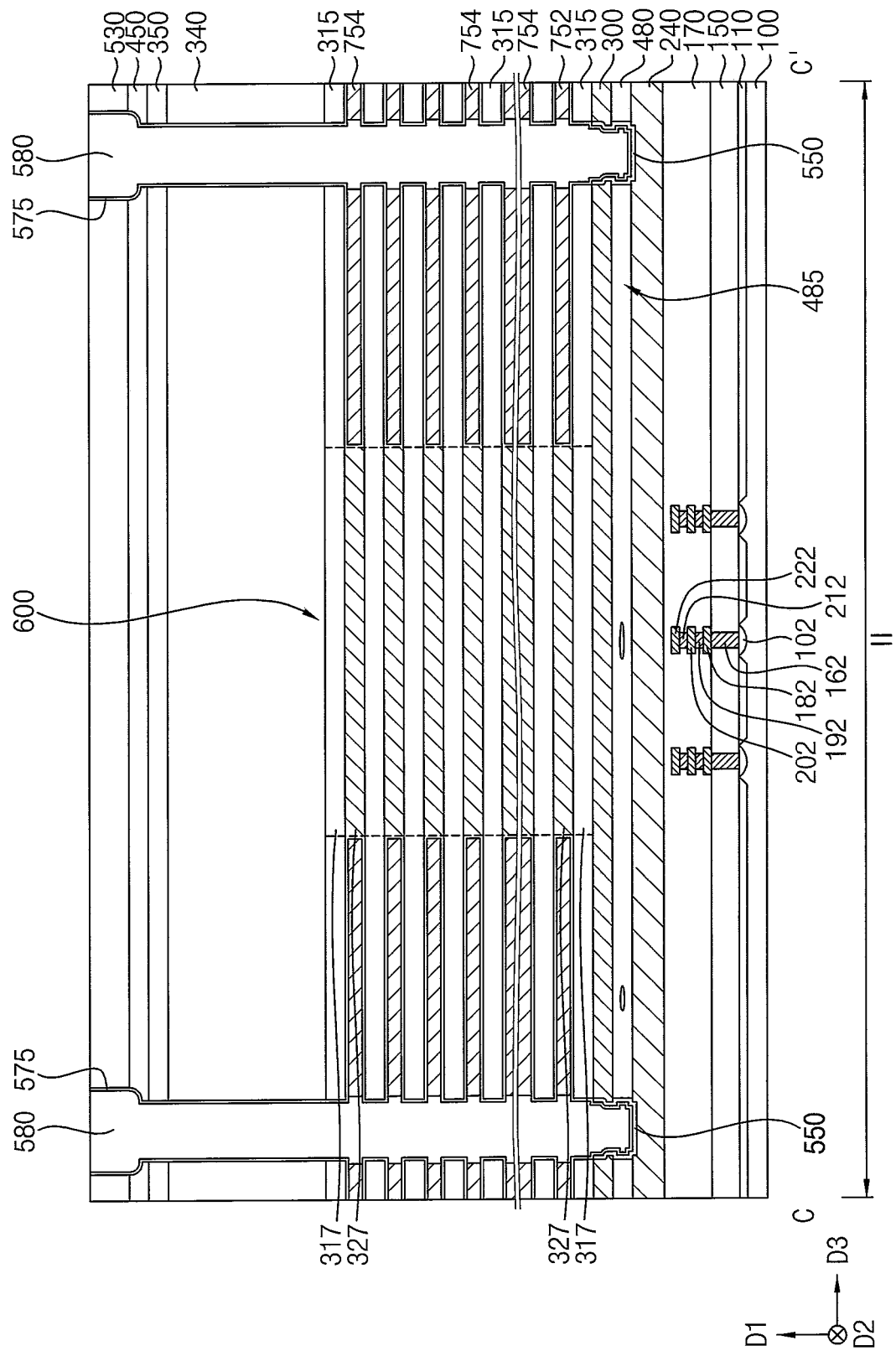

Referring to FIGS. 25 and 26, a third division pattern 580 filling the second and fourth openings 460 and 540, and a fourth division pattern 585 filling the third and fifth openings 465 and 545 may be formed on the second blocking layer 570, and may be planarized until an upper surface of the second support layer 530 is exposed. Thus, the second blocking layer 570 may be transformed into a second blocking pattern 575. The third and fourth division patterns 580 and 585 may include an oxide, e.g., silicon oxide.

Figure 27:
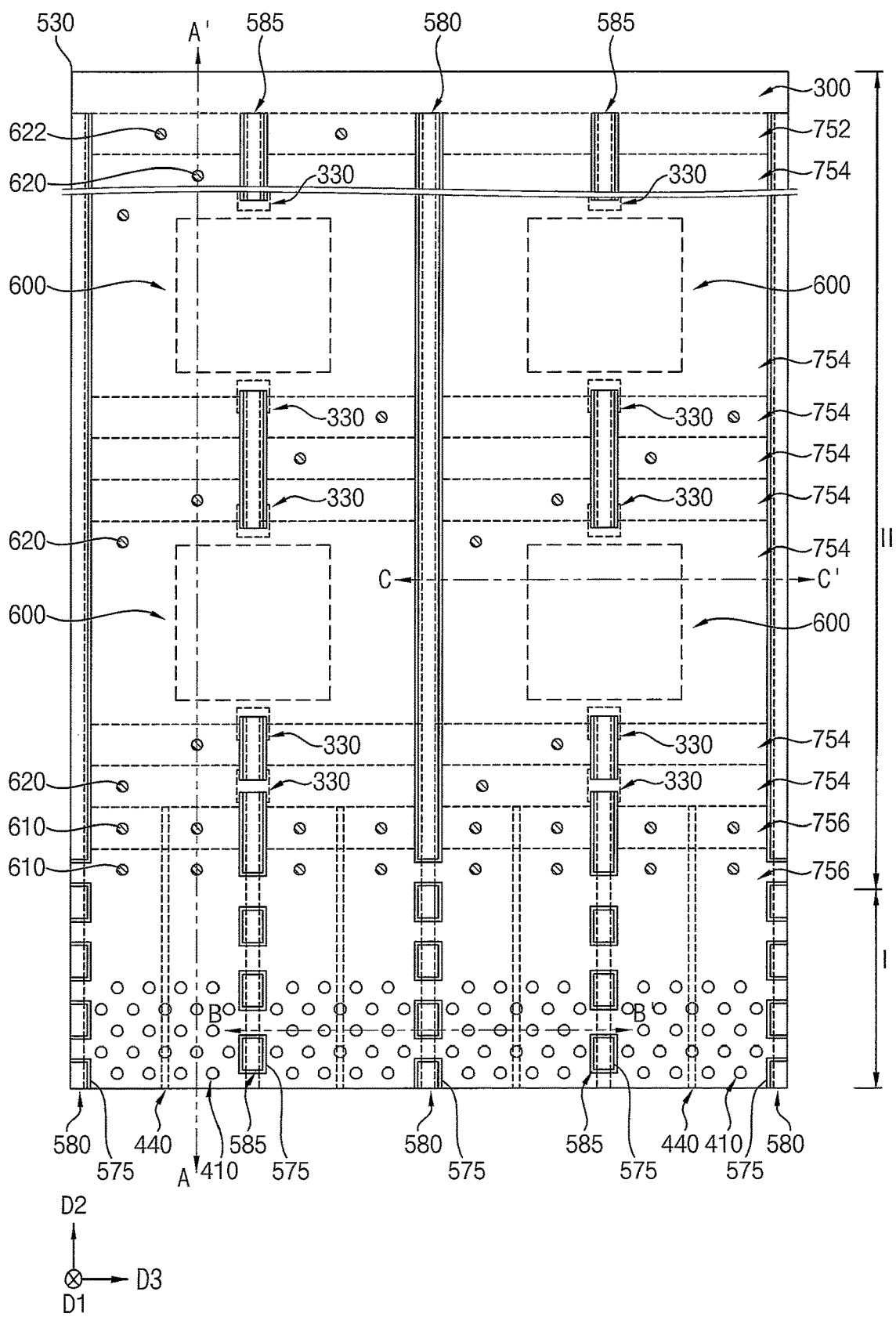
Figure 28:
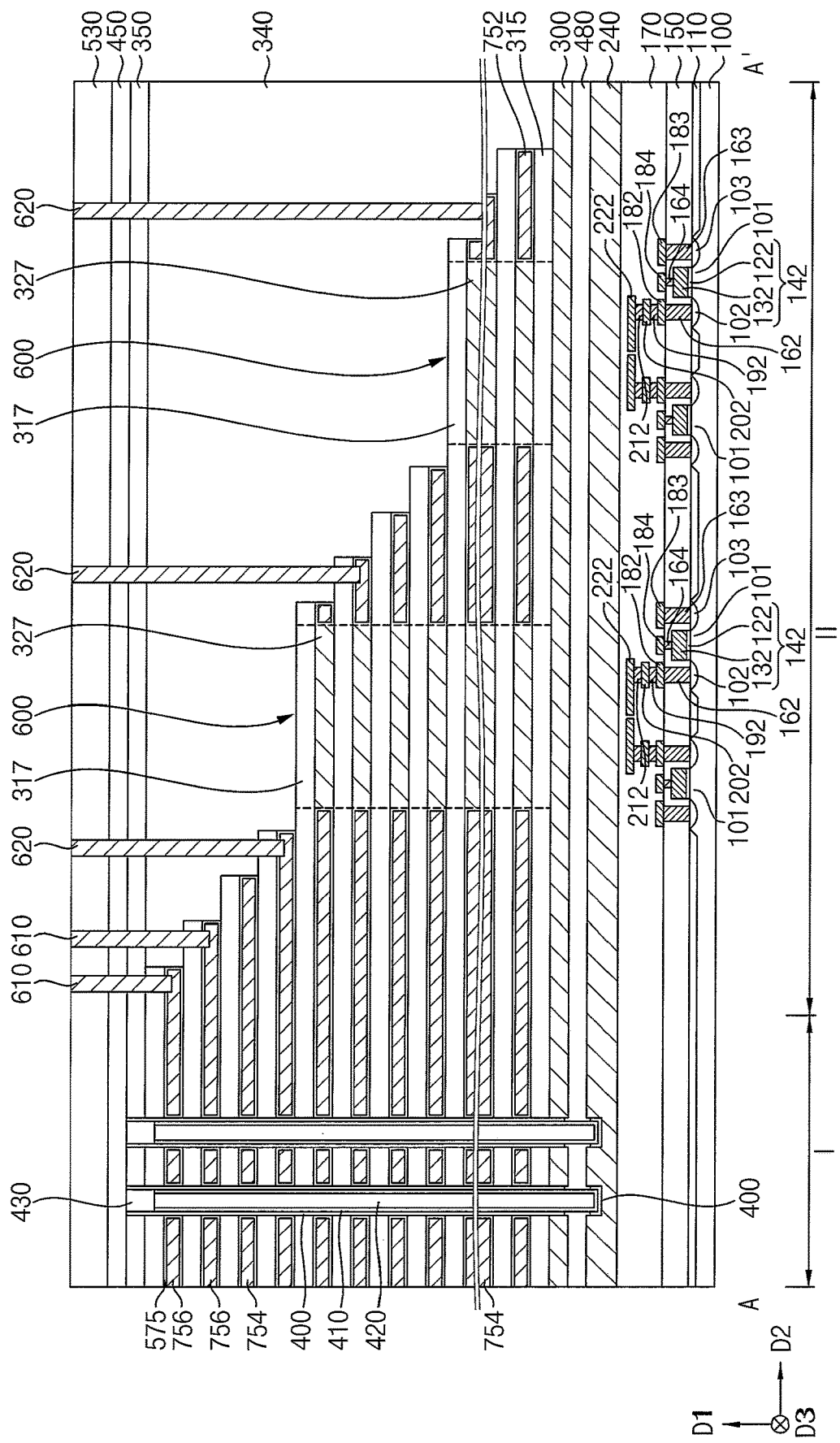

Referring to FIGS. 27 and 28, first to third upper contact plugs 610, 620 and 622 may be formed through the second support layer 530, the third to fifth insulating interlayers 340, 350 and 450, and the first insulation pattern 315 on the second region II of the first substrate 100. The first to third upper contact plugs 610, 620 and 622 may contact pads of the third, second and first gate electrodes 756, 754 and 752, respectively. FIG. 27 shows a layout of the first to third upper contact plugs 610, 620 and 622, however, embodiments are not limited thereto.

Figure 29:
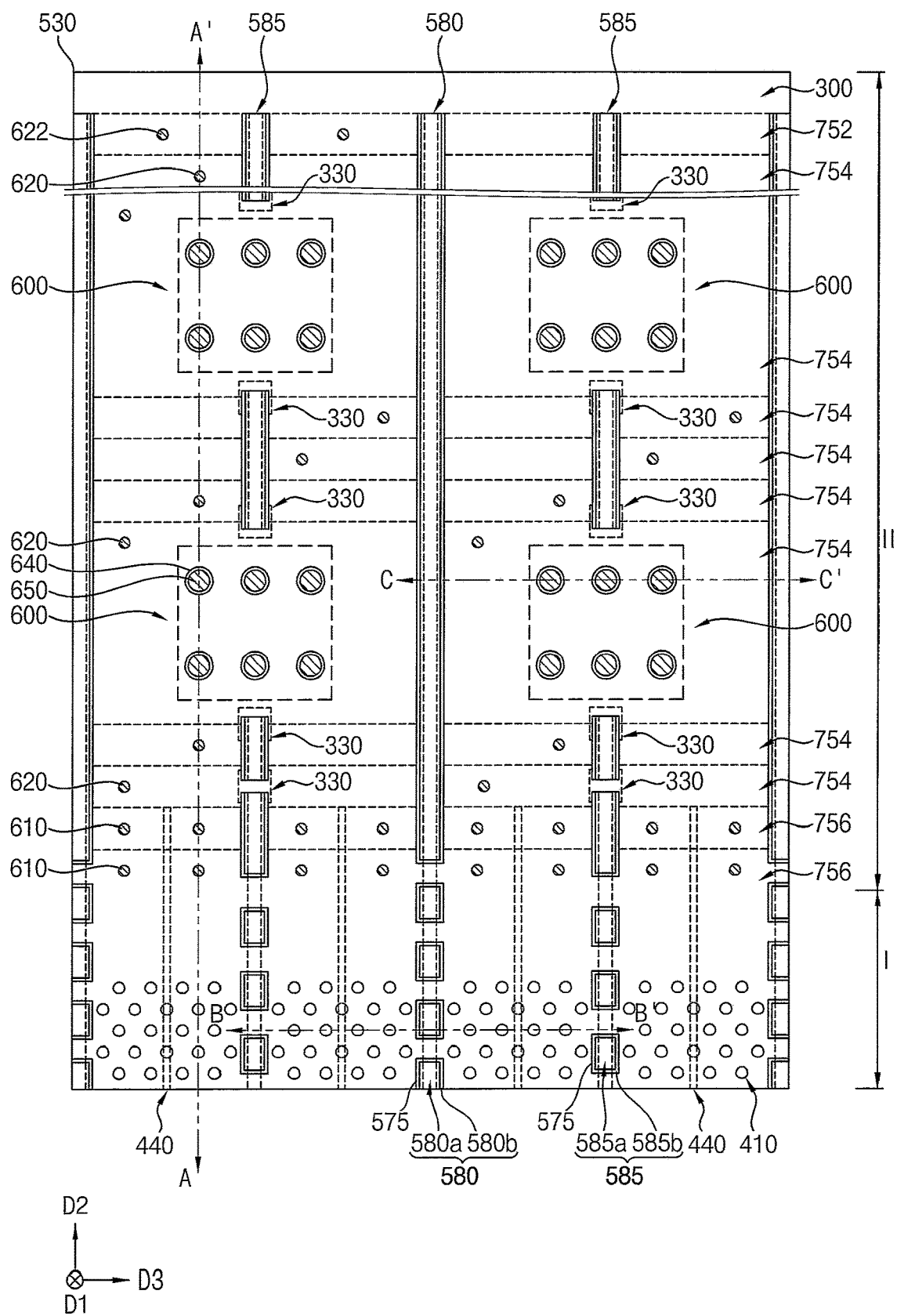
Figure 30:
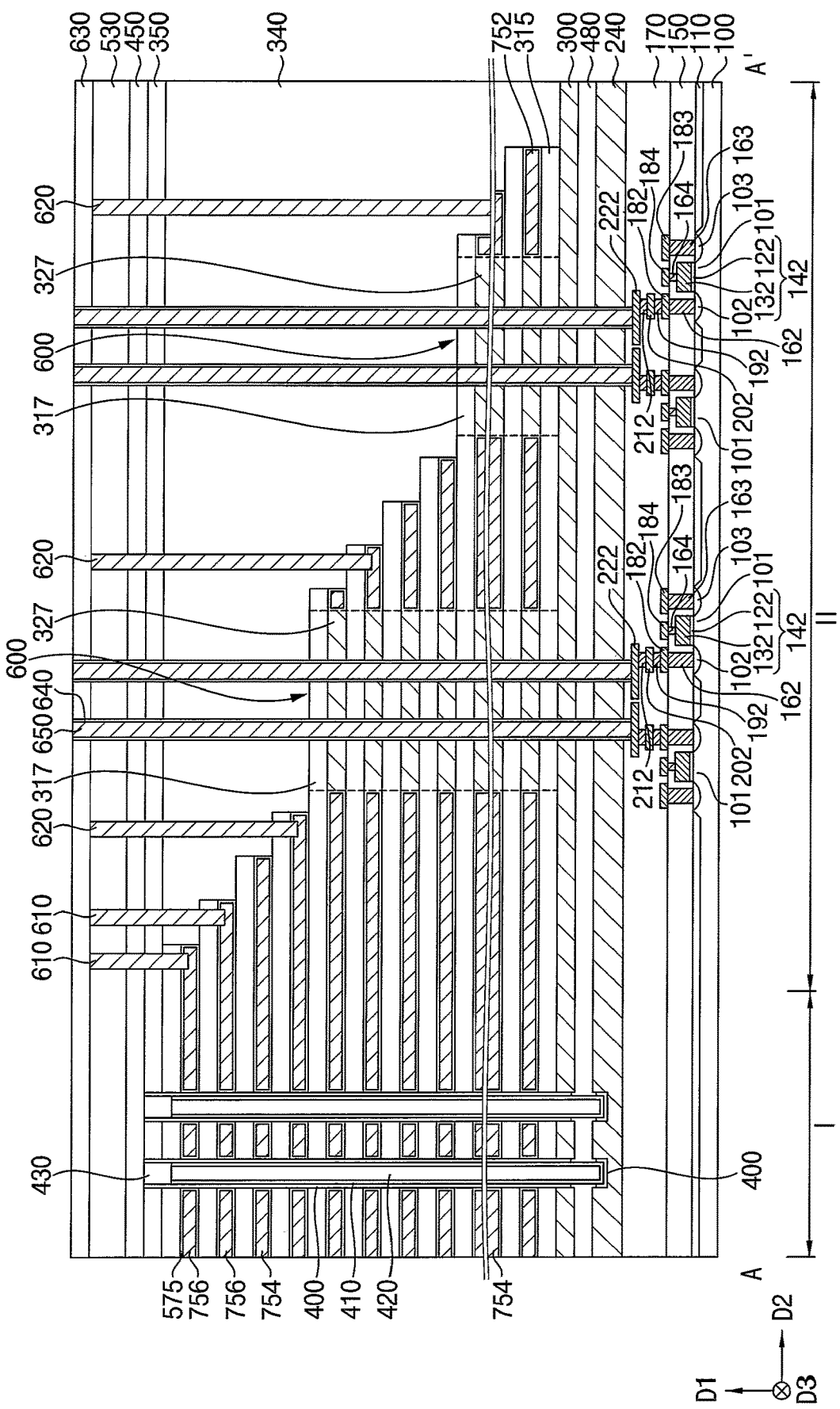

Referring to FIGS. 29 and 30, a sixth insulating interlayer 630 may be formed on the second support layer 530 and the first to third upper contact plugs 610, 620 and 622, and a through via 650 may be formed through the insulation pattern structure 600, the first support layer 300, the channel connection pattern 480, the CSP 240, and an upper portion of the second insulating interlayer 170 to contact an upper surface of the eighth lower wiring 222 on the second region II of the first substrate 100.

In example embodiments, a plurality of through vias 650 may be spaced apart from each other in an area where the insulation pattern structure 600 is formed. In the drawings, six through vias 650 are shown in each area, however, embodiments are not limited thereto.

A fourth insulation pattern 640 may be formed on a sidewall of the through via 650, and thus may be electrically insulated from the first support layer 300, the channel connection pattern 480, and the CSP 240. However, the through via 650 may extend through the insulation pattern structure 600, i.e., through the second and third insulation patterns 317 and 327, to be electrically insulated from the first to third gate electrodes 752, 754 and 756. Thus, if an insulation pattern is formed on sidewalls of the first support layer 300, the channel connection pattern 480, and the CSP 240, the fourth insulation pattern 640 may not be formed.

The first to third upper contact plugs 610, 620 and 622 and the through via 650 may include, e.g., a metal, a metal nitride, a metal silicide, etc., and the fourth insulation pattern 640 may include an oxide, e.g., silicon oxide. A common source contact plug may be further formed on a portion of the first support layer 300 not covered by the gate electrode structure.

Referring to FIGS. 31 to 34, a seventh insulating interlayer 660 may be formed on the sixth insulating interlayer 630, the fourth insulation pattern 640, and the through via 650, and fourth and fifth upper contact plugs 672 and 674, a sixth upper contact plug, and seventh and eighth upper contact plugs 680 and 690 may be formed. The fourth and fifth upper contact plugs 672 and 674 and the sixth upper contact plug may extend through the sixth and seventh insulating interlayers 630 and 660 to contact upper surfaces of the first to third upper contact plugs 610, 620 and 622, respectively, the seventh upper contact plug 680 may extend through the seventh insulating interlayer 660 to contact an upper surface of the through via 650, and the eighth upper contact plug 690 may extend through the second support layer 530 and the fifth to seventh insulating interlayers 450, 630 and 660 to contact an upper surface of the capping pattern 430.

An eighth insulating interlayer 700 may be formed on the seventh insulating interlayer 660, the fourth and fifth upper contact plugs 672 and 674, the sixth upper contact plug, and the seventh and eighth upper contact plugs 680 and 690, and first and second upper wirings 712 and 714, a third upper wiring, and fourth and fifth upper wirings 720 and 730 may be formed. The first and second upper wirings 712 and 714 may contact upper surfaces of the fourth and fifth upper contact plugs 672 and 674, respectively, the third upper wiring may contact an upper surface of the sixth upper contact plug, and the fourth and fifth upper wirings 720 and 730 may contact upper surfaces of the seventh and eighth upper contact plugs 680 and 690, respectively.

In example embodiments, the fifth upper wiring 730 may extend in the third direction D3, and a plurality of fifth upper wirings 730 may be formed in the second direction D2 to serve as bit lines, respectively. Alternatively, an upper via and a sixth upper wiring may be further formed on the fifth upper wiring 730, and the sixth upper wiring may serve as a bit line. The first and second upper wirings 712 and 714, the third upper wiring, and the fourth upper wiring 720 may be formed to have various layouts on the second region II of the first substrate 100.

The semiconductor device may be manufactured by the above processes.

As discussed above, the second support layer 530 may at least partially cover the upper surfaces of the second and third sacrificial layer structures 520 and 525 extending through the mold in the second direction D2 on the first region I of the first substrate 100. Thus, the mold may not lean or fall down in the third direction D3 because of the second support layer 530.

While the second support layer 530 may not cover the area where the second and third openings 460 and 465 are formed on the second region II of the first substrate 100, the plurality of third openings 465 may be formed to be spaced apart from each other (instead of continuously extending along the second direction D2). Therefore, the mold may remain between the plurality of third openings 465, so the mold may not lean or fall down in the third direction D3.

The second support layer 530 may not cover the area where the second and third openings 460 and 465 are formed on the second region II of the first substrate 100. Thus, even though a height difference occurs between the upper surface of the portion of the second support layer 530 on the insulation pattern structure 600 and the upper surface of the portion of the second support layer 530 on the mold portion including the gate electrodes 752, 754 and 756, cracks may not occur in the portion of the second support layer 530 adjacent to the area where the second and third openings 460 and 465 are formed.

That is, the second support layer 530 may at least partially cover the upper surfaces of the second and third sacrificial layer structures 520 and 525 on the first region I of the first substrate 100, so that the mold may not lean or fall down in the third direction D3. Additionally, the second support layer 530 may not cover the area where the second and third openings 460 and 465 are formed on the second region II of the first substrate 100, so that cracks may not occur in the portion of the second support layer 530.

Referring to FIGS. 31 to 34, the semiconductor device may include the lower circuit pattern on the first substrate 100 including the first region I and the second region II at least partially surrounding the first region I, the CSP 240 on the lower circuit pattern, the gate electrode structure including the gate electrodes 752, 754 and 756 spaced apart from each other in the first direction D1 on the CSP 240, each of which may extend in the second direction D2 on the first and second regions I and II of the first substrate 100, and sequentially stacked in a staircase shape, the channels 410 each of which may contact the upper surface of the CSP 240 and may extend through the gate electrode structure in the first direction D1 on the first region I of the first substrate 100, the charge storage structure on the sidewall of each of the channels 410, the insulation pattern structure 600 extending through the gate electrode structure on the second region II of the first substrate 100, the through via 650 extending through the insulation pattern structure 600 and the CSP 240 in the first direction D1 to be electrically connected to the lower circuit pattern, the third division patterns 580 at each of opposite sides of the gate electrode structure in the third direction, each of which may extend in the second direction D2 on the first and second regions I and II of the first substrate 100, the fourth division patterns 585, each of which may extend through the gate electrode structure between ones of the third division patterns 580 neighboring in the third direction D3, spaced apart from each other in the second direction D2, and the second support layer 530 on the gate electrode structure on the first and second regions I and II of the first substrate 100, which may contact an upper sidewall of each of the third and fourth division patterns 580 and 585. The fourth division pattern 585 may partially extend through the second support layer 530, and the second support layer 530 may not contact an upper surface of a portion of the third division pattern 580 adjacent to the insulation pattern structure 600 in the third direction D3 on the second region II of the first substrate 100.

The second support layer 530 may be formed on a portion of each of the third and fourth division patterns 580 and 585 in the first region I of the first substrate 100 to contact the upper surfaces thereof, e.g., the second support layer 530 may contact the upper surfaces of the third division patterns 580 between adjacent fourth openings 540 in the second direction D2 (e.g., dashed lines indicating the fourth openings 540 between adjacent rectangles indicating the third division patterns 580 in the first region in FIG. 27). The second support layer 530 may be continuous on the third and fourth division patterns 580 and 585 on the first region I of the first substrate 100. The upper surface of the second support layer 530 may be formed at the same height as upper surfaces of the third and fourth division patterns 580 and 585 on the second region II of the first substrate 100, e.g., the upper surface of the second support layer 530 may be coplanar with the upper surfaces of the third and fourth division patterns 580 and 585 on the second region II. The second support layer 530 may not contact the upper surfaces of the third and fourth division patterns 580 and 585 on the second region II of the first substrate 100.

In example embodiments, the third division pattern 580 may continuously extend in the second direction D2 on the first and second regions I and II of the first substrate 100. Each of the second and fourth division patterns 440 and 585 may continuously extend in the second direction D2 at least on the first region I of the first substrate 100. The first division pattern 330 may be formed on the second region II of the first substrate 100. In example embodiments, the fourth division pattern 585 may overlap the insulation pattern structure 600 in the second direction D2.

In example embodiments, each of the third division patterns 580 may include a first lower portion 580a and a first upper portion 580b which are sequentially stacked and contact each other. Each of the fourth division patterns 585 may include a second lower portion 585a and a second upper portion 585b which are sequentially stacked and contact each other.

In one embodiment, a width in the third direction of each of the first and second upper portions 580b and 585b D3 may be greater than a width in the third direction of the first and second lower portions 580a and 585b, however, embodiments are not limited thereto.

In one embodiment, a lower surface of each of the first and second upper portions 580*b* and 585*b* may be lower than a lower surface of the second support layer 530, however, embodiments are not limited thereto.

In example embodiments, the first upper portions 580*b* of the third division pattern 580 and the second upper portions 585*b* of the fourth division pattern 585 may be arranged in a zigzag pattern toward the second direction D2 or the third direction D3 on the first region I of the first substrate 100 when viewed from above. In example embodiments, each of the first upper portions 580*b* of the third division pattern 580 may partially overlap the second upper portions 585*b* of the fourth division patterns 585 along the third direction D3 on the first region I of the first substrate 100.

In example embodiments, the second blocking pattern 575 including a metal oxide may be formed on a sidewall of each of the third and fourth division patterns 580 and 585.

In example embodiments, the semiconductor device may further include the first division pattern 330 contacting a sidewall of the first gate electrode 752 at a lowermost level in the gate electrode structure, and overlapping in the first direction D1 a portion of the gate electrode structure between neighboring ones of the fourth division patterns 585 spaced apart from each other in the second direction D2. Additionally, the semiconductor device may further include the second division pattern 440 extending in the second direction D2 between the third and fourth division patterns 580 and 585 and extending through the third gate electrodes 756 at upper two levels, respectively, of the gate electrode structure.

In example embodiments, the first insulation patterns 315 may be formed between neighboring ones of the first to third gate electrodes 752, 754 and 756 spaced apart from each other in the first direction D1, so as to electrically insulate the first to third gate electrodes 752, 754 and 756 from each other.

In example embodiments, the insulation pattern structure may include the second and third insulation patterns 317 and 327 alternately and repeatedly stacked in the first direction D1. Each of the second insulation patterns 317 may include an oxide, and each of the third insulation patterns 327 may include a nitride.

In example embodiments, the gate electrodes 752, 754 and 756 may be stacked in a staircase shape on the second region II of the first substrate 100.

In example embodiments, the gate electrodes 752, 754 and 756 may be stacked in a staircase shape on the second region II of the first substrate 100, and each of the gate electrodes 752, 754 and 756 may include the pad not overlapped by upper gate electrodes in the first direction D1 on the second region II of the first substrate 100. The pads of the gate electrodes 752, 754 and 756 may include the first pad having a relatively short length in the second direction D2 and the second pad having a relatively long length in the second direction D2, and the insulation pattern structure 600 may extend through the second pad. The gate electrode structure may include a plurality of second pads spaced apart from each other in the second direction D2, and a plurality of insulation pattern structures 600 may be formed to be spaced apart from each other in the second direction D2.

Figure 35:
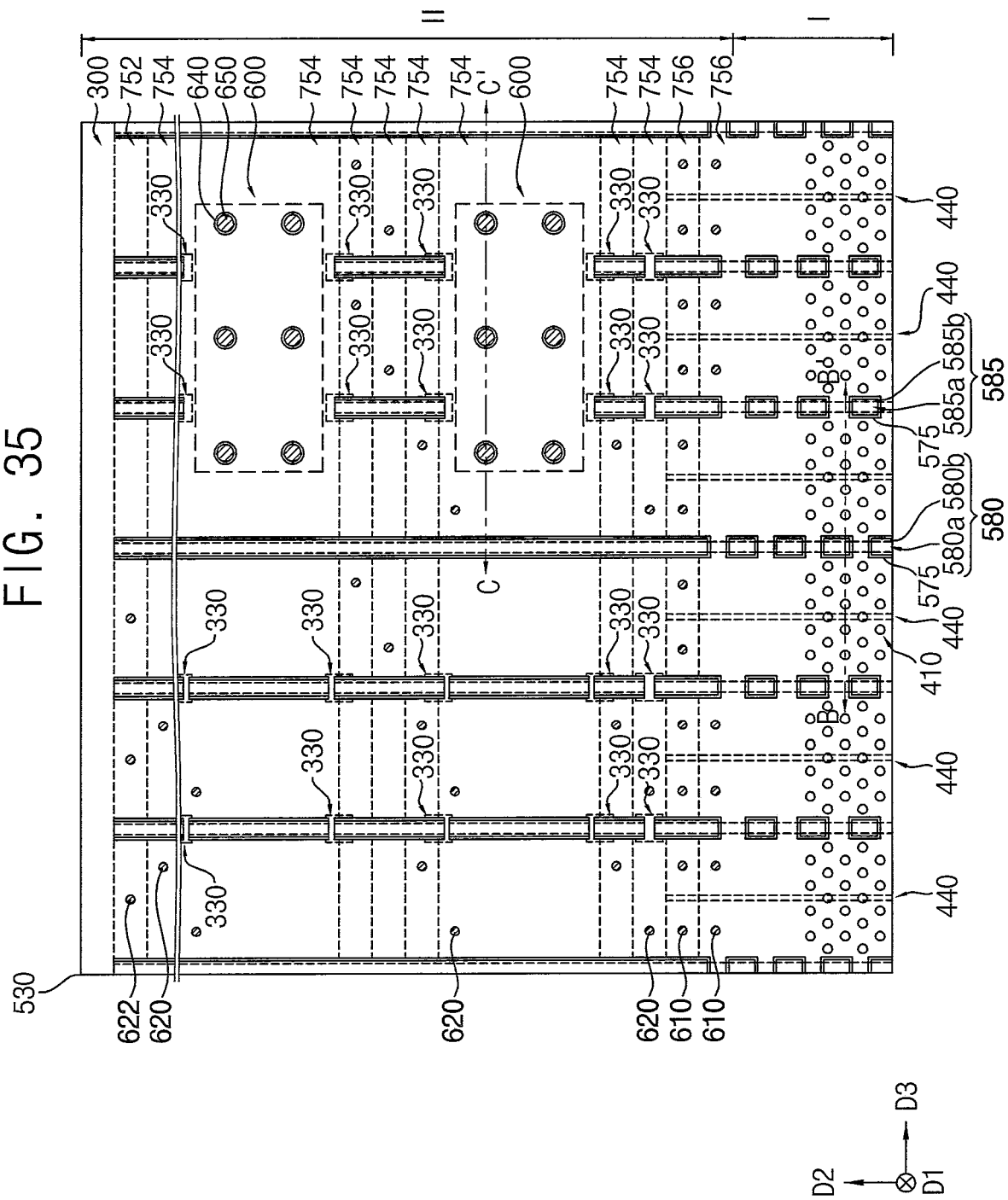
FIG. 35 is a cross-sectional view of a semiconductor device in accordance with example embodiments.

FIG. 35 is a plan view illustrating a semiconductor device in accordance with example embodiments, which shows an area corresponding to two memory blocks and may correspond to FIG. 29. The semiconductor device may be substantially the same as or similar to that of FIGS. 29 to 34, except for the layout of the fourth division pattern 585.

Referring to FIG. 35, the insulation pattern structure 600 may be formed in each of the second pads of the gate electrode structure of one memory block, and the through via 650 may extend in the first direction D1 through the insulation pattern structure 600. Some of the fourth division patterns 585 extending through the second pads of the gate electrode structure of another memory block may be spaced apart in the second direction D2 from others of the fourth division patterns 585 extending through the first pads of the gate structure thereof.

Figure 31:
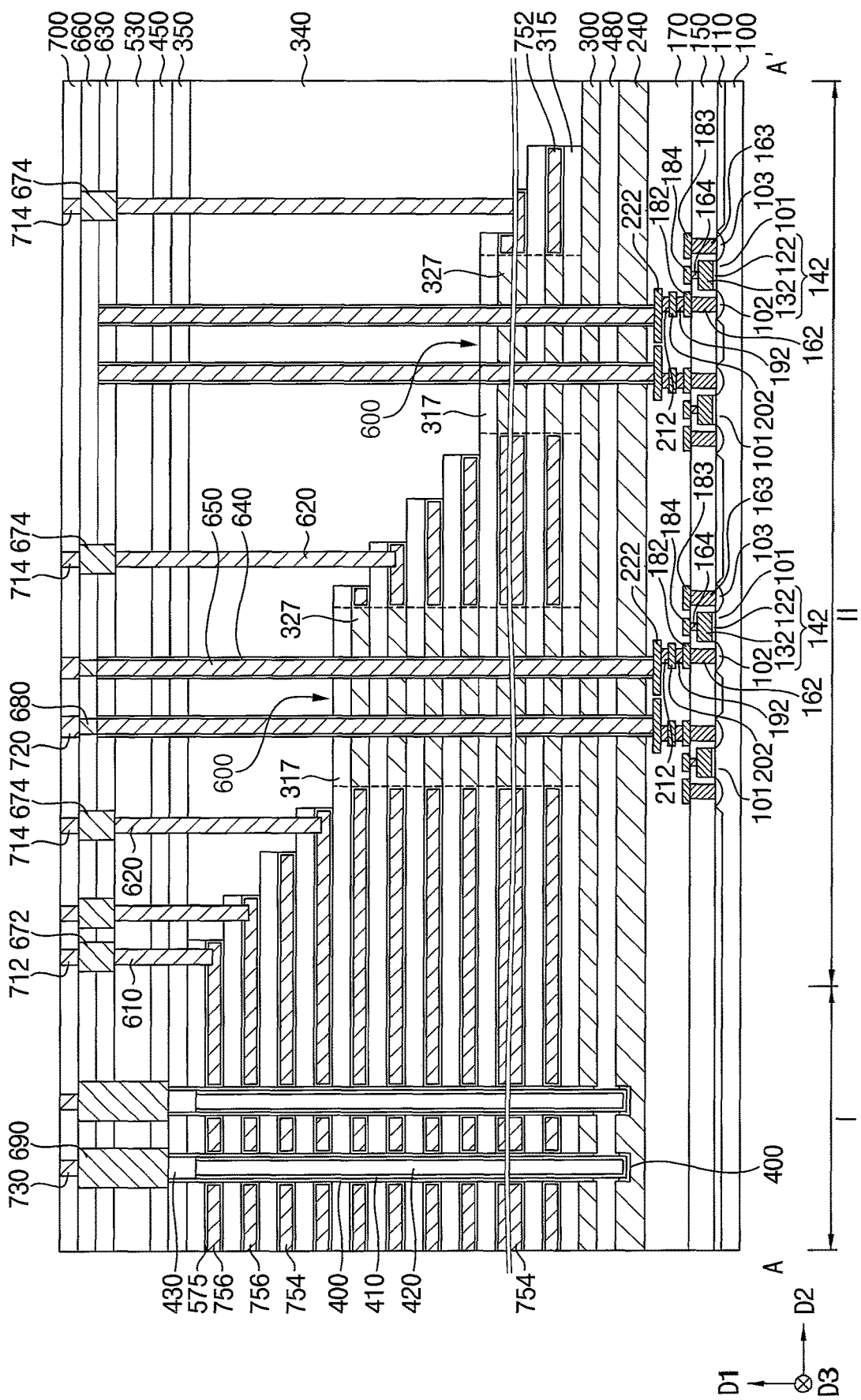
Figure 32:
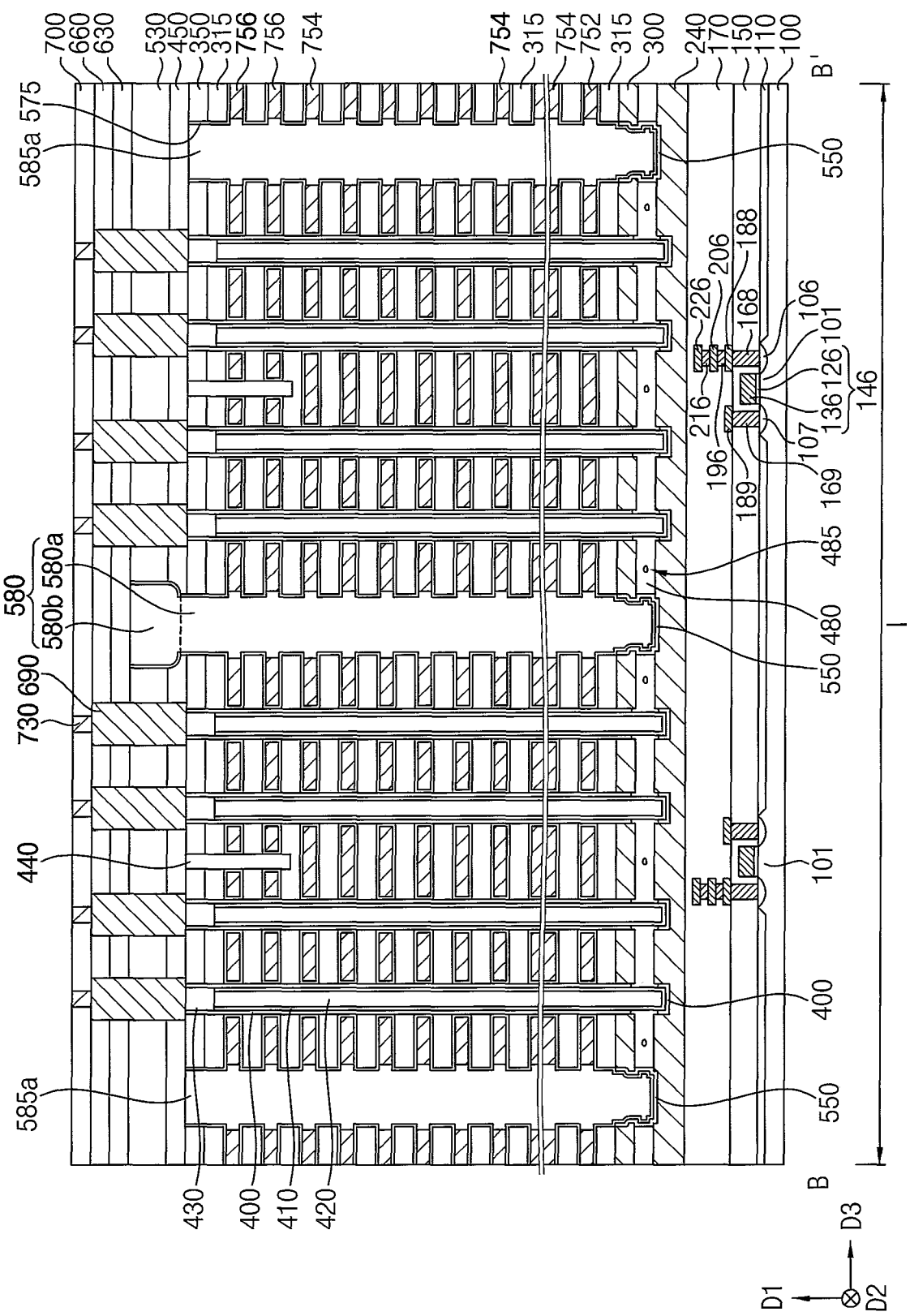
Figure 33:
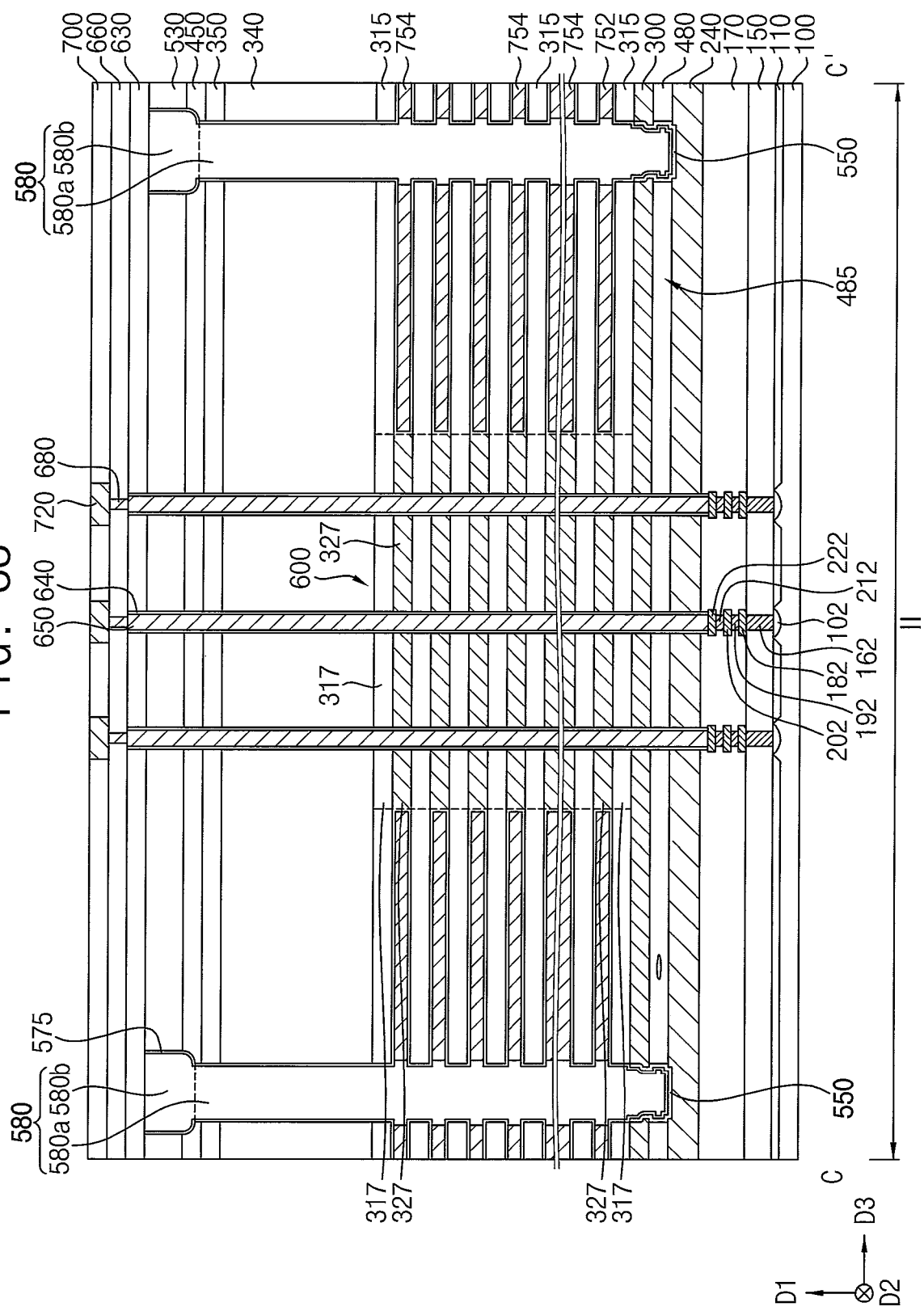
Figure 34:
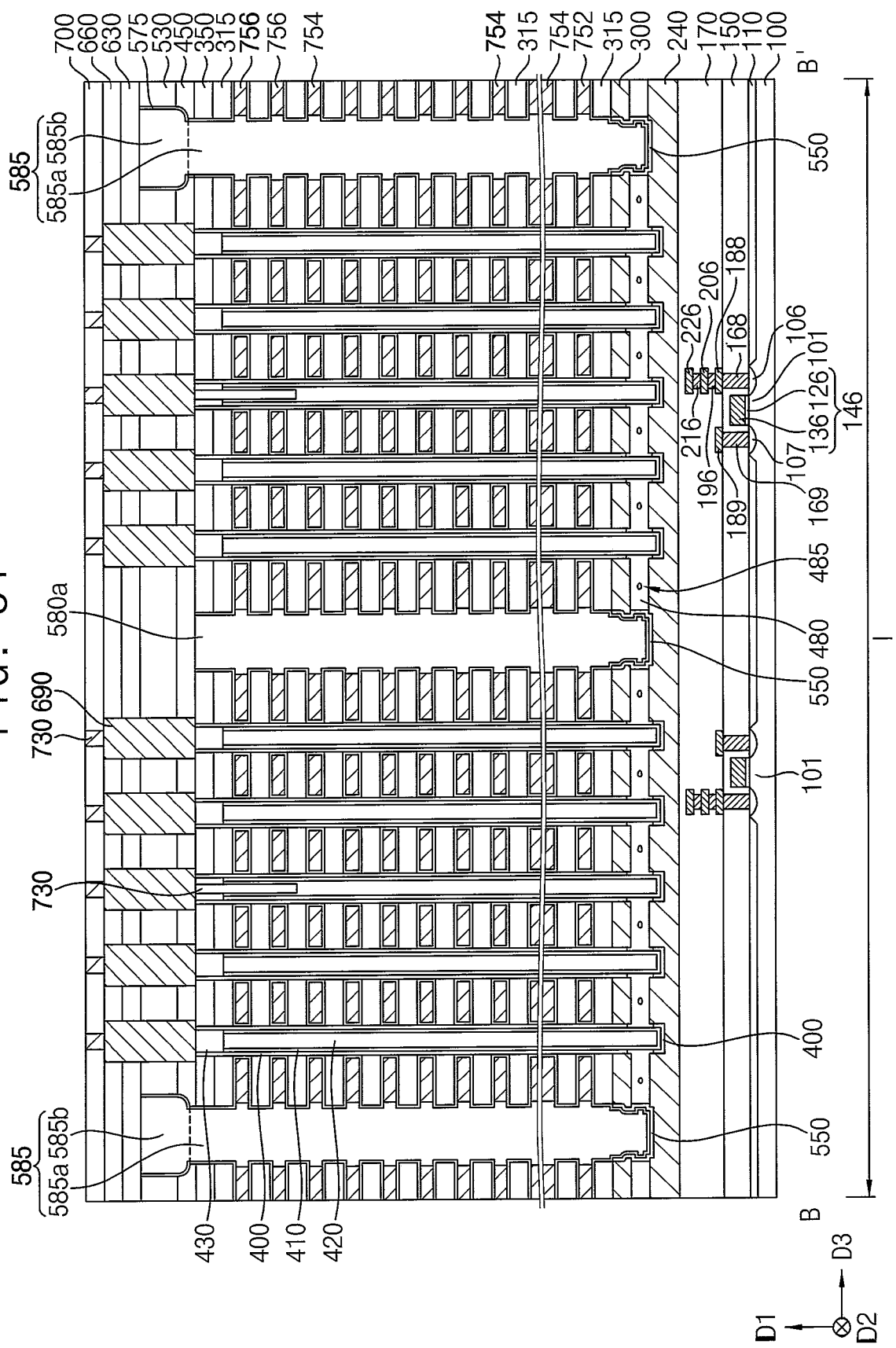
Figure 36:
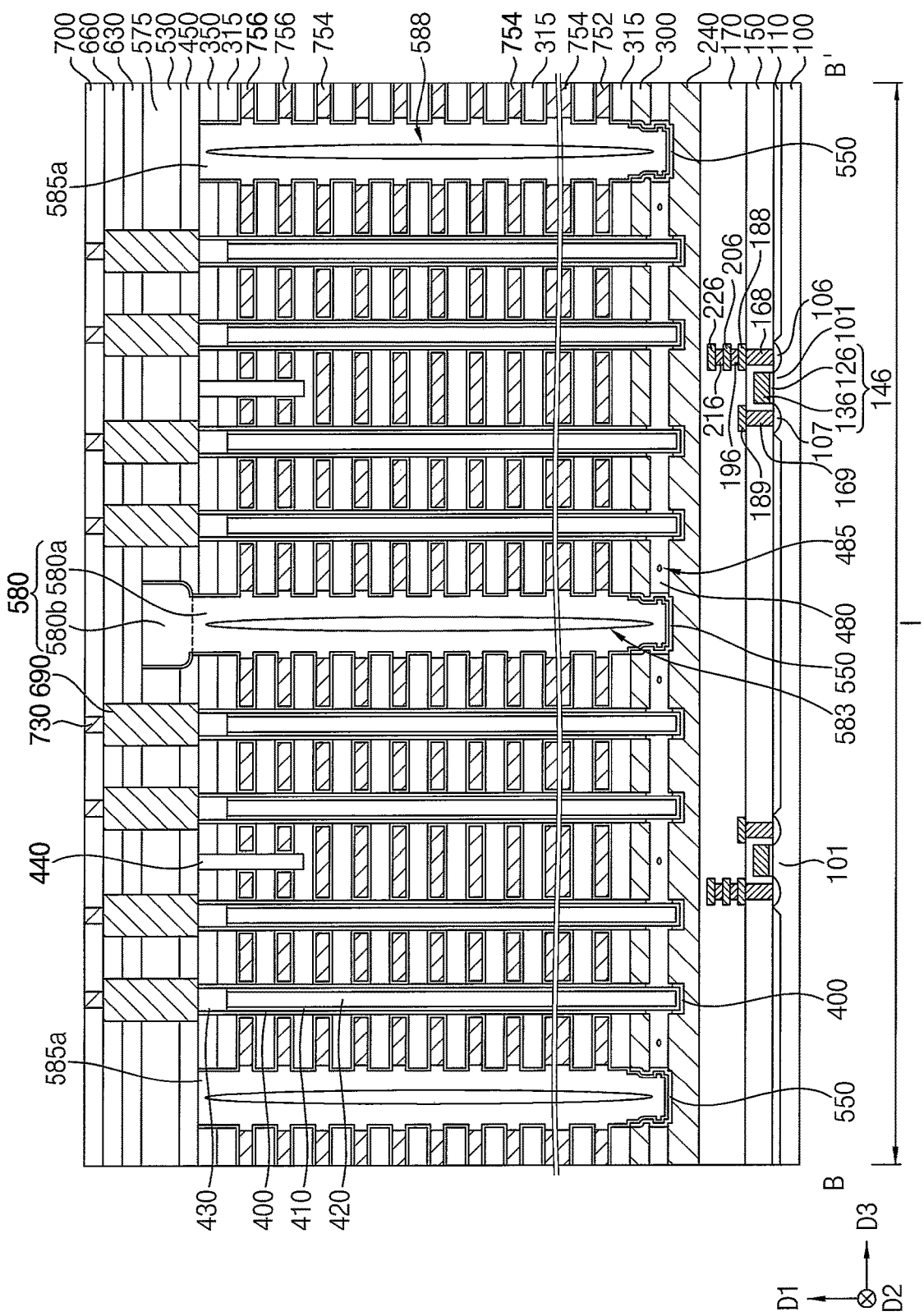
FIG. 36 is a cross-sectional view of a semiconductor device in accordance with example embodiments.

FIG. 36 is a cross-sectional view illustrating a semiconductor device in accordance with example embodiments, which may correspond to FIG. 32. This semiconductor device may be substantially the same as or similar to that of FIGS. 29 to 34, except for the cross-sectional shapes of the third and fourth division patterns 580 and 585 in the third direction D3.

Referring to FIG. 36, voids 583 and 588 may be formed in the third and fourth division patterns 580 and 585, respectively. Each of the voids 583 and 588 may extend in the first direction D1 in the third and fourth division patterns 580 and 585. FIG. 36 shows that each of the voids 583 and 588 has an elliptical shape, however, embodiments are not limited thereto.

FIG. 37 is a cross-sectional view illustrating a semiconductor device in accordance with example embodiments, which may correspond to FIG. 32. This semiconductor device may be substantially the same as or similar to that of FIGS. 29 to 34, except for the memory channel structure 435, the channel connection pattern 480, and the first support layer 300.

Referring to FIG. 37, the memory channel structure 435 may further include a semiconductor pattern 590 on the first substrate 100, and the charge storage structure 400, the channel 410, the filling pattern 420, and the capping pattern 430 may be formed on the semiconductor pattern 590.

The semiconductor pattern 590 may include, e.g., single crystalline silicon or polysilicon. In an example embodiment, an upper surface of the semiconductor pattern 590 may be located between heights of lower and upper surfaces of the first insulation pattern 315 between the first and second gate electrodes 752 and 754. The charge storage structure 400 may have a cup-like shape of which a central lower surface is opened on the upper surface of the semiconductor pattern 590, and may contact an edge upper surface of the semiconductor pattern 590. The channel 410 may have a cup-like shape, and may contact a central upper surface of the semiconductor pattern 590. Thus, the channel 410 may be electrically connected to the CSP 240 through the semiconductor pattern 590.

The channel connection pattern 480 and the first support layer 300 may not be formed between the CSP 240 and the first gate electrode 752. In an example embodiment, one of the first insulation patterns 315 between the first and second gate electrodes 752 and 754 may have a thickness greater than those of other ones of the first insulation patterns 315.

FIG. 38 is a cross-sectional view illustrating a semiconductor device in accordance with example embodiments, which may correspond to FIG. 31. This semiconductor device may be substantially the same as or similar to that of FIGS. 29 to 34, except that the semiconductor device is upside down. The peripheral circuit wirings may correspond to the peripheral circuit wirings 4110 of FIG. 4, and the circuit structure may correspond to the first structure 4100 of FIG. 4.

Referring to FIG. 38, a second substrate 800 may be formed instead of the CSP 240. Ninth and tenth insulating interlayers 760 and 780 may be sequentially stacked on the second insulating interlayer 170, and a fifth lower via 740 may be further formed in the second insulating interlayer 170. The second substrate 800 may include, e.g., silicon, germanium, silicon-germanium or a III-V compound such as GaP, GaAs, GaSb, etc. In some embodiments, the second substrate 800 may be, e.g., a silicon-on-insulator (SOI) substrate or a germanium-on-insulator (GOI) substrate.

The ninth and tenth insulating interlayers 760 and 780 may include, e.g., an oxide such as silicon oxide, and first and second bonding structures 770 and 790 may be formed therethrough, respectively. The first and second bonding structures 770 and 790 may correspond to the first and second bonding structures of FIG. 4, respectively, and may include, e.g., a metal such as copper. The fifth lower vias 740 may be respectively formed on the corresponding eighth lower wirings 222 to be electrically connected to the first bonding structures 770, respectively.

By way of summation and review, when the number of stacked gate electrodes in the semiconductor device increases, a mold including sacrificial layers for forming the gate electrodes may be bent or collapsed in a process of forming the gate electrodes. Thus, example embodiments provide a method of preventing the mold from bending and/or collapsing.

As discussed above, example embodiments provide a semiconductor device having improved characteristics, and an electronic system including the same. That is, a semiconductor device in accordance with example embodiments may include a second support layer formed on gate electrode structures, and third and fourth division patterns formed between the gate electrode structures. Thus, the gate electrode structures on the cell array region of the substrate may not be bent or collapsed by the second support layer, and the gate electrode structures on the extension region of the substrate may not be bent or collapsed by the third and fourth division patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a cell array region and an extension region, the substrate having memory cells on the cell array region, and the extension region at least partially surrounding the cell array region;
a gate electrode structure on the cell array region and the extension region of the substrate, the gate electrode structure including gate electrodes spaced apart from each other in a first direction substantially perpendicular to an upper surface of the substrate, and each of the gate electrodes extending in a second direction substantially parallel to the upper surface of the substrate;
a channel extending in the first direction through the gate electrode structure on the cell array region of the substrate;
a first division pattern extending in the second direction on the cell array region and the extension region of the substrate, the first division pattern being at opposite sides of the gate electrode structure in a third direction, the third direction being substantially parallel to the upper surface of the substrate and crossing the second direction;
an insulation pattern structure partially extending through the gate electrode structure on the extension region of the substrate;
a through via extending in the first direction through the insulation pattern structure; and
a support layer on the gate electrode structure and extending on the cell array region and the extension region of the substrate, the support layer contacting an upper sidewall of the first division pattern, and the support layer not contacting an upper surface of a portion of the first division pattern on the extension region of the substrate that is adjacent to the insulation pattern structure in the third direction.

2. The semiconductor device as claimed in claim 1, wherein an upper surface of the support layer is substantially coplanar with the upper surface of the first division pattern on the extension region of the substrate.

3. The semiconductor device as claimed in claim 1, wherein the support layer is formed on a portion of the first division pattern on the cell array region of the substrate, and contact an upper surface of the portion of the first division pattern.

4. The semiconductor device as claimed in claim 1, further comprising a second division pattern on the cell array region and the extension region of the substrate, the second division pattern extending through the gate electrode structure between respective ones of the first division patterns neighboring in the third direction, and the second division pattern extending partially through the support layer.

5. The semiconductor device as claimed in claim 4, wherein the support layer contacts an upper sidewall of the second division pattern on the extension region of the substrate.

6. The semiconductor device as claimed in claim 4, wherein the support layer does not contact an upper surface of the second division pattern on the extension region of the substrate.

7. The semiconductor device as claimed in claim 4, wherein the support layer is formed on a portion of the second division patterns on the cell array region of the substrate, and contact an upper surface of the portion of the second division pattern.

8. The semiconductor device as claimed in claim 1, wherein the insulation pattern structure includes first and second insulation patterns alternately and repeatedly stacked in the first direction, the first and second insulation patterns including different insulating materials from each other.

9. The semiconductor device as claimed in claim 1, further comprising:
a lower circuit pattern on the substrate; and
a common source plate (CSP) on the lower circuit pattern, wherein:
the gate electrode structure is on the CSP,
the channel contacts an upper surface of the CSP, and
the through via extends through the insulation pattern structure and the CSP, and is electrically connected to the lower circuit pattern.

10. The semiconductor device as claimed in claim 1, wherein the gate electrodes are arranged in a staircase shape of which an extension length in the second direction decreases in a stepwise manner from a lower level to an upper level, and end portions in the second direction of the gate electrodes are arranged on the extension region of the substrate.

11. A semiconductor device, comprising:
a substrate including a cell array region and an extension region, the substrate having memory cells on the cell array region, and the extension region at least partially surrounding the cell array region;
gate electrode structures on the cell array region and the extension region of the substrate, each of the gate electrode structures including gate electrodes spaced apart from each other in a first direction substantially perpendicular to an upper surface of the substrate, and the gate electrodes being arranged in a staircase shape of which an extension length in a second direction decreases in a stepwise manner from a lower level to an upper level and having end portions in the second direction on the extension region of the substrate, the second direction being substantially parallel to the upper surface of the substrate, and the gate electrode structures being spaced apart from each other in a third direction substantially parallel to the upper surface of the substrate and crossing the second direction;
a channel extending in the first direction through each of the gate electrode structures on the cell array region of the substrate;
a first division pattern extending in the second direction between the gate electrode structures on the cell array region and the extension region of the substrate, the first division pattern dividing the gate electrode structures from each other; and
a support layer on the gate electrode structures, the support layer extending on the cell array region and the extension region of the substrate, and contacting an upper sidewall of the first division pattern,
wherein the support layer does not contact an upper surface of a first portion of the first division pattern on the extension region of the substrate, the support layer partially contacting an upper surface of a second portion of the first division pattern on the cell array region of the substrate.

12. The semiconductor device as claimed in claim 11, wherein the support layer on the cell array region of the substrate is continuous on the first division pattern between ones of the gate electrode structures neighboring in the third direction.

13. The semiconductor device as claimed in claim 11, wherein an upper surface of the support layer is substantially coplanar with the upper surface of the first portion of the first division pattern on the extension region of the substrate.

14. The semiconductor device as claimed in claim 11, further comprising a second division pattern through the gate electrode structure adjacent to the first division pattern in the third direction on the cell array region and the extension region of the substrate, the second division pattern extending partially through the support layer.

15. The semiconductor device as claimed in claim 14, wherein the support layer contacts an upper sidewall of the second division pattern, and does not contact an upper surface of the second division pattern on the extension region of the substrate.

16. The semiconductor device as claimed in claim 14, wherein the support layer partially contacts an upper surface of the second division pattern on the cell array region of the substrate.

17. The semiconductor device as claimed in claim 14, further comprising:
an insulation pattern structure extending partially through each of the gate electrode structures on the extension region of the substrate; and
a through via extending in the first direction through the insulation pattern structure.

18. The semiconductor device as claimed in claim 17, wherein the second division pattern overlaps the insulation pattern structure in the second direction.

19. An electronic system, comprising:
a semiconductor device having:
a memory cell structure including:
a substrate with a cell array region and an extension region, the substrate having memory cells in the cell array region, and the extension region at least partially surrounding the cell array region,
a gate electrode structure on the cell array region and the extension region of the substrate, the gate electrode structure including gate electrodes spaced apart from each other in a first direction substantially perpendicular to an upper surface of the substrate, and each of the gate electrodes extending in a second direction substantially parallel to the upper surface of the substrate,
a channel extending in the first direction through the gate electrode structure on the cell array region of the substrate,
a first division pattern extending in the second direction on the cell array region and the extension region of the substrate, the first division pattern being at opposite sides of the gate electrode structure in a third direction substantially parallel to the upper surface of the substrate and crossing the second direction,
an insulation pattern structure extending partially through the gate electrode structure on the extension region of the substrate,
a through via extending in the first direction through the insulation pattern structure, and
a support layer on the gate electrode structure and extending on the cell array region and the extension region of the substrate, the support layer contacting an upper sidewall of the first division pattern, and the support layer not contacting an upper surface of a portion of the first division pattern adjacent to the insulation pattern structure in the third direction on the extension region of the substrate;
peripheral circuit wirings electrically connected to the memory cell structure; and
an input/out pad electrically connected to the peripheral circuit wirings;
and
a controller electrically connected to the semiconductor device through the input/output pad, the controller to control the semiconductor device.

20. The electronic system as claimed in claim 19, wherein an upper surface of the support layer is substantially coplanar with the upper surface of the first division pattern on the extension region of the substrate.

* * * * *